US008686394B2

(12) United States Patent
Pellizzer et al.

(10) Patent No.: US 8,686,394 B2
(45) Date of Patent: Apr. 1, 2014

(54) SEMICONDUCTOR CONSTRUCTIONS AND MEMORY ARRAYS

(75) Inventors: Fabio Pellizzer, Cornate d'Adda (IT); Cinzia Perrone, Bellusco (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/551,873

(22) Filed: Jul. 18, 2012

(65) Prior Publication Data

US 2014/0021439 A1 Jan. 23, 2014

(51) Int. Cl.
*H01L 29/06* (2006.01)

(52) U.S. Cl.
USPC ............ 257/5; 257/1; 257/2; 257/E23.168; 438/104; 438/131; 438/283; 438/421

(58) Field of Classification Search
USPC .............. 257/1–5, 786, E23.168, E45.002; 438/104, 131, 283, 421, 430, 597, 239, 438/240–242
See application file for complete search history.

(56) References Cited

U.S. PATENT DOCUMENTS

| 7,514,288 | B2 | 4/2009 | Lung et al. |
| 7,514,334 | B2 | 4/2009 | Chen et al. |
| 7,929,340 | B2 | 4/2011 | Lung et al. |
| 8,030,128 | B1 | 10/2011 | Sutardja et al. |
| 8,043,961 | B2 | 10/2011 | Moore et al. |
| 8,053,365 | B2 | 11/2011 | Humayun et al. |
| 2007/0120107 | A1 | 5/2007 | Hayakawa |
| 2008/0035961 | A1 | 2/2008 | Chen et al. |
| 2009/0302472 | A1 | 12/2009 | Yoon et al. |
| 2010/0163817 | A1 | 7/2010 | Savransky et al. |

FOREIGN PATENT DOCUMENTS

WO WO 2008/027163 3/2008

*Primary Examiner* — Mark A Laurenzi
(74) *Attorney, Agent, or Firm* — Wells St. John P.S.

(57) ABSTRACT

Some embodiments include methods of forming semiconductor constructions. Carbon-containing material is formed over oxygen-sensitive material. The carbon-containing material and oxygen-sensitive material together form a structure having a sidewall that extends along both the carbon-containing material and the oxygen-sensitive material. First protective material is formed along the sidewall. The first protective material extends across an interface of the carbon-containing material and the oxygen-sensitive material, and does not extend to a top region of the carbon-containing material. Second protective material is formed across the top of the carbon-containing material, with the second protective material having a common composition to the first protective material. The second protective material is etched to expose an upper surface of the carbon-containing material. Some embodiments include semiconductor constructions, memory arrays and methods of forming memory arrays.

18 Claims, 28 Drawing Sheets

US 8,686,394 B2

SEMICONDUCTOR CONSTRUCTIONS AND MEMORY ARRAYS

TECHNICAL FIELD

Semiconductor constructions, memory arrays, methods of forming semiconductor constructions and methods of forming memory arrays.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

The phase change materials may be detrimentally affected (i.e., "poisoned") if they are exposed oxygen, and accordingly it is desired to develop new architectures and fabrication methods which alleviate or prevent such oxygen exposure.

BRIEF DESCRIPTION OF THE DRAWINGS

FIG. 1 shows a preliminary processing stage; and FIGS. 2 and 3 show process stages that can follow that of FIG. 1. FIG. 2 shows a process stage that can occur in the absence of mask misalignment, and FIG. 3 show a process stage that can occur if there is some mask misalignment.

DETAILED DESCRIPTION OF THE ILLUSTRATED EMBODIMENTS

A problem that may occur during fabrication of integrated circuitry comprising oxygen-sensitive material is described with reference to FIGS. 1-3.

Figure 1:
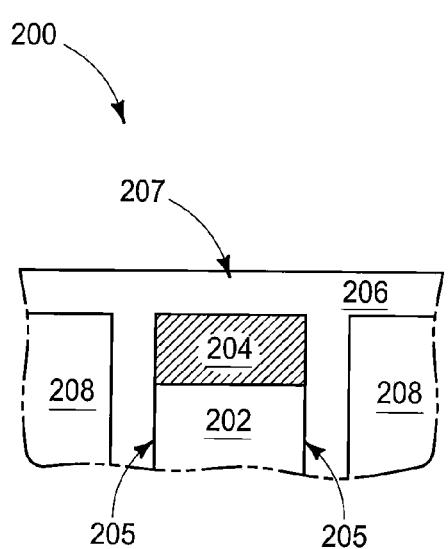
FIGS. 1-3 are cross-sectional side views of a construction showing various process stages of an example method of forming an opening for an electrical interconnect.

FIG. 1 shows a construction 200 comprising oxygen-sensitive material 202 beneath an electrically conductive cap 204. In some embodiments, the materials 202 and 204 may be part of a PCM cell; with the oxygen-sensitive material being phase change material (such as chalcogenide) and the cap being an electrode. The materials 202 and 204 are part of a structure 207 having sidewalls 205 that extend along both the oxygen-sensitive material 202 and the cap 204. A first electrically insulative material 206 is over the cap and along sidewalls of the structure 207. The first electrically insulative material may comprise a non-oxygen-containing composition, such as, for example, silicon nitride; and may be utilized as a protective material to protect oxygen-sensitive material 202 from being exposed to oxygen. A second electrically insulative material 208 is laterally outward of the first electrically insulative material, and is spaced from the oxygen-sensitive material 202 by the protective material 206. The electrically insulative material 208 may comprise oxygen; and in some embodiments may comprise, for example, one or more of silicon dioxide, borophosphosilicate glass (BPSG), phosphosilicate glass (PSG), aluminum oxide, etc. The electrically insulative materials 206 and 208 may be alternatively referred to as dielectric materials; with the terms "electrically insulative material" and "dielectric material" being synonymous with one another.

Figure 2:
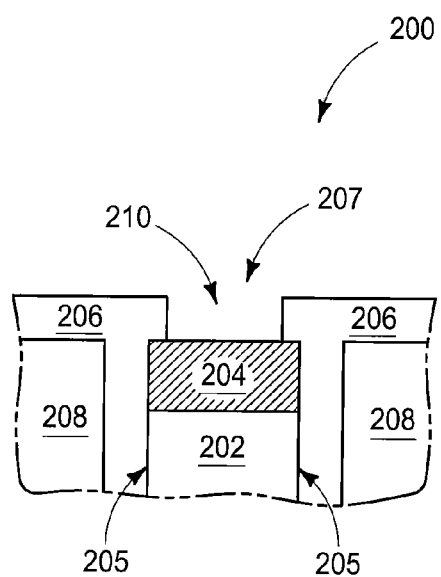
Figure 3:
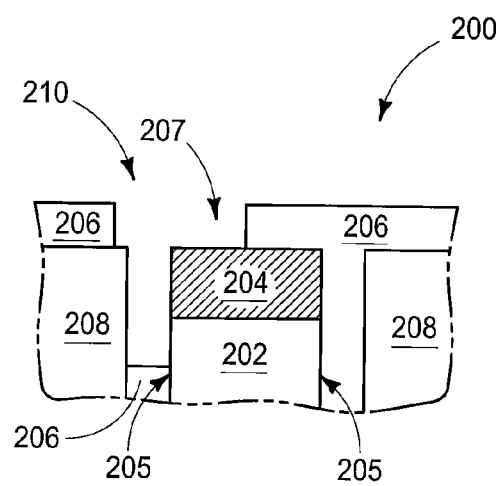

FIG. 2 shows a processing stage subsequent to that of FIG. 1, and shows an opening 210 formed through material 206 to expose an upper surface of cap 204. In the embodiment of FIG. 2, the opening is properly aligned with the cap 204 and accordingly only the cap is exposed within the opening. In contrast, FIG. 3 shows a processing stage analogous to that of FIG. 2, except that opening 210 is misaligned relative to cap 204. Thus, the opening extends along one of the sidewalls 205 to expose a region of the oxygen-sensitive material 202. The exposed region of oxygen-sensitive material 202 may problematically become poisoned by oxygen in a subsequent processing stage.

Some embodiments described herein include methods of alleviating or preventing the problem described with reference to FIGS. 1-3. Some embodiments include new architectures.

Figure 4:
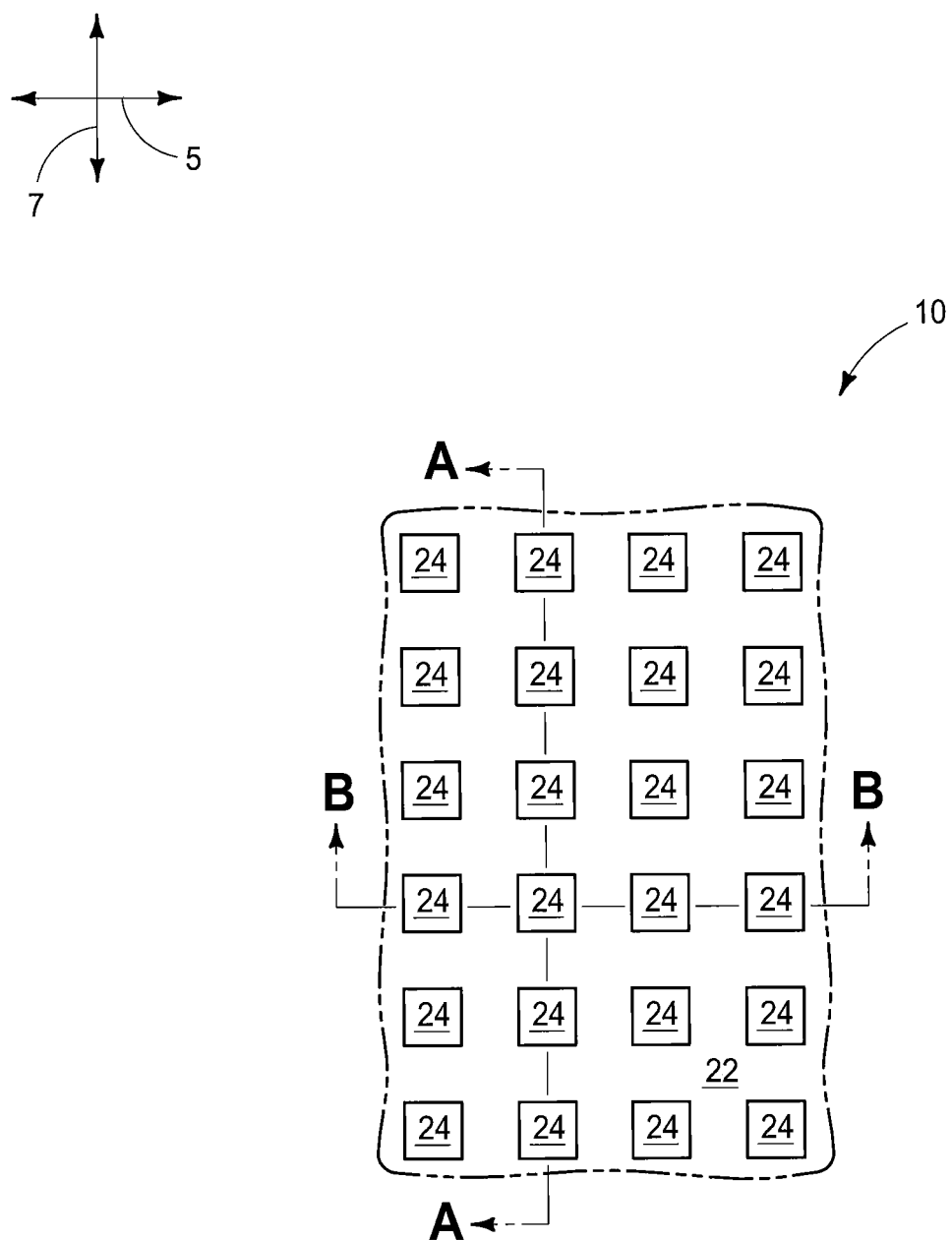
FIGS. 4-6 are a top view and cross-sectional side views of a construction at a processing stage of an example embodiment method. The cross-sectional views of FIGS. 5 and 6 are along the lines A-A and B-B, respectively, of FIG. 4.
Figure 5:
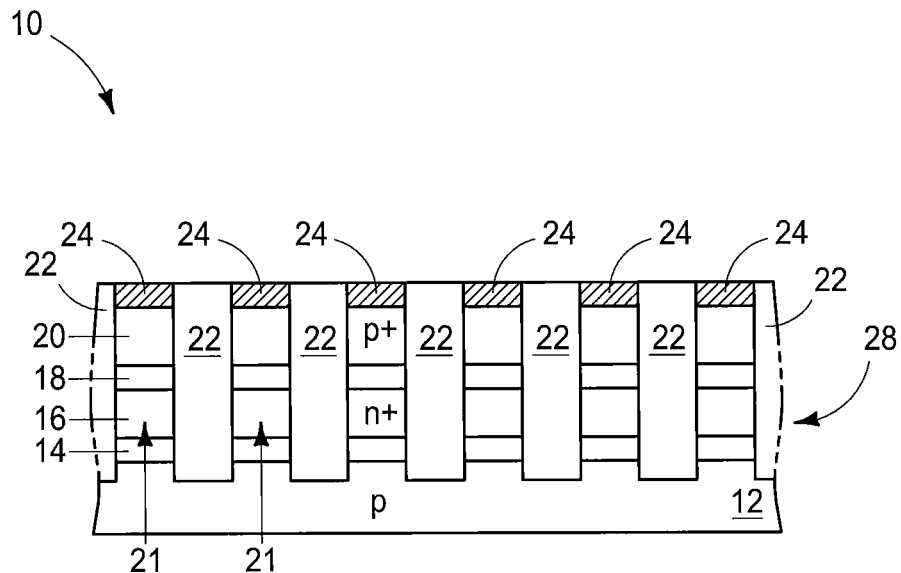
Figure 6:
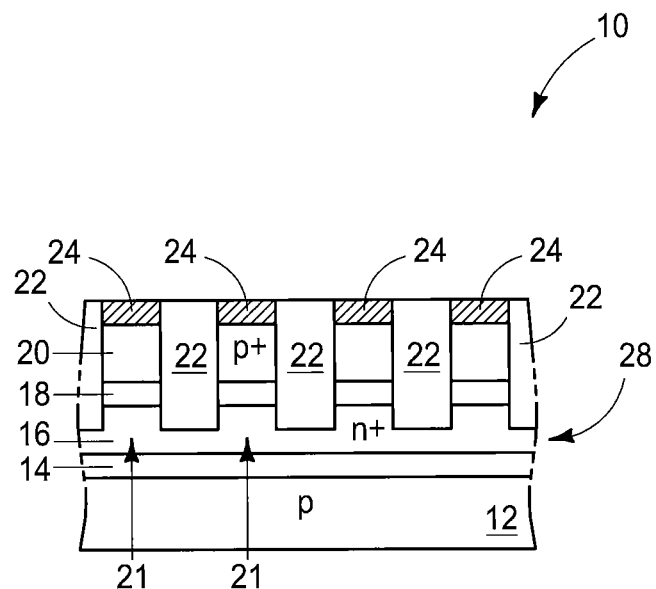

FIGS. 4-6 diagrammatically illustrate a portion of a semiconductor construction 10 at a preliminary processing stage of an example embodiment method. FIG. 4 shows a top view of the construction, and FIGS. 5 and 6 show cross-sections along the lines A-A and B-B, respectively, of FIG. 4.

The construction 10 comprises a p-type doped region 12, and various doped regions 14, 16, 18 and 20 over the region 12. The regions 12, 14, 16 and 18 are patterned into a plurality of pedestals 21 (only some of which are labeled), with such pedestals being separated from one another by intervening dielectric material 22. Such material 22 may comprise any suitable composition or combination of compositions, and in some embodiments may comprise oxygen-containing material; such as, for example, silicon dioxide, borophosphosilicate glass (BPSG), phosphosilicate glass (PSG), etc. The doped regions 14, 16, 18 and 20 correspond to doped semiconductor material, such as doped silicon.

The regions 16 and 20 are heavily-doped, and thus are indicated to be n+ doped and p+ doped, respectively. The p-type doped region 12, n-type doped region 16 and p-type doped region 20 together form pn diodes in some embodiments. The regions 14 and 18 are lightly doped, and are utilized as graded junctions to improve performance of such diodes. In some embodiments, the regions 12, 16 and 20 may be regions of bipolar junction transistors.

Electrically conductive material 24 is formed across the tops of the diodes. Such electrically conductive material may comprise any suitable composition or combination of compositions; and in some embodiments may comprise metal silicide (such as, for example, cobalt silicide, titanium silicide, nickel silicide, etc.). The conductive material 24 may be formed by silicidation of upper surfaces of doped regions 20 in some embodiments. Although the conductive material 24 is shown to have an upper surface substantially coplanar with the upper surface of insulative material 22, in other embodiments the conductive material 24 may have an upper surface which is above or below the upper surface of insulative material 22.

In the shown embodiment, the tops of pedestals 21 are square (as indicated by the square shape of material 24 in the top view of FIG. 4), but in other embodiments the tops of the pedestals may have other shapes; such as, for example, polygonal shapes, round shapes, elliptical shapes, etc.

The pedestals 21 are arranged in a grid (as indicated by the material 24 being arranged in a grid in the top view of FIG. 4). Such grid has a first direction along an axis 5, and a second direction along an axis 7. In the shown embodiment, the second direction is substantially orthogonal to the first direction; with the term "substantially orthogonal" meaning that the directions orthogonal to within reasonable tolerances of fabrication and measurement. The cross-section of FIG. 5 is along axis 7, and that of FIG. 6 is along axis 5.

The cross-sections of FIGS. 5 and 6 show that the pedestals 21 extend deeper along the cross-section of FIG. 5 than along the cross-section of FIG. 6. Specifically, the pedestals extend through regions 14 and 16, and into region 12 along the cross-section of FIG. 5; and extend only partially into region 16 along the cross-section of FIG. 6. In some embodiments, heavily-doped region 16 may be considered to form wordlines which interconnect pluralities of diodes along the direction of axis 5; with an example wordline 28 being illustrated in FIG. 6.

The illustrated pn diodes are examples of access devices which may be incorporated into a memory array. Other access devices may be utilized in place of, or in addition to, the illustrated diodes in other embodiments. Such other access devices may include, for example, field effect transistors, bipolar junction transistors, PIN diodes, etc.

In some embodiments, construction 10 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrate described above. Construction 10 may correspond to a semiconductor substrate containing one or more materials associated with integrated circuit fabrication in some embodiments. Some of the materials may be under the shown region 12 and/or may be laterally adjacent the shown region 12; and may correspond to, for example, one or more of refractory metal materials, barrier materials, diffusion materials, insulator materials, etc. In some embodiments, the regions 12, 14, 16, 18 and 20 may comprise monocrystalline silicon.

Figure 7:
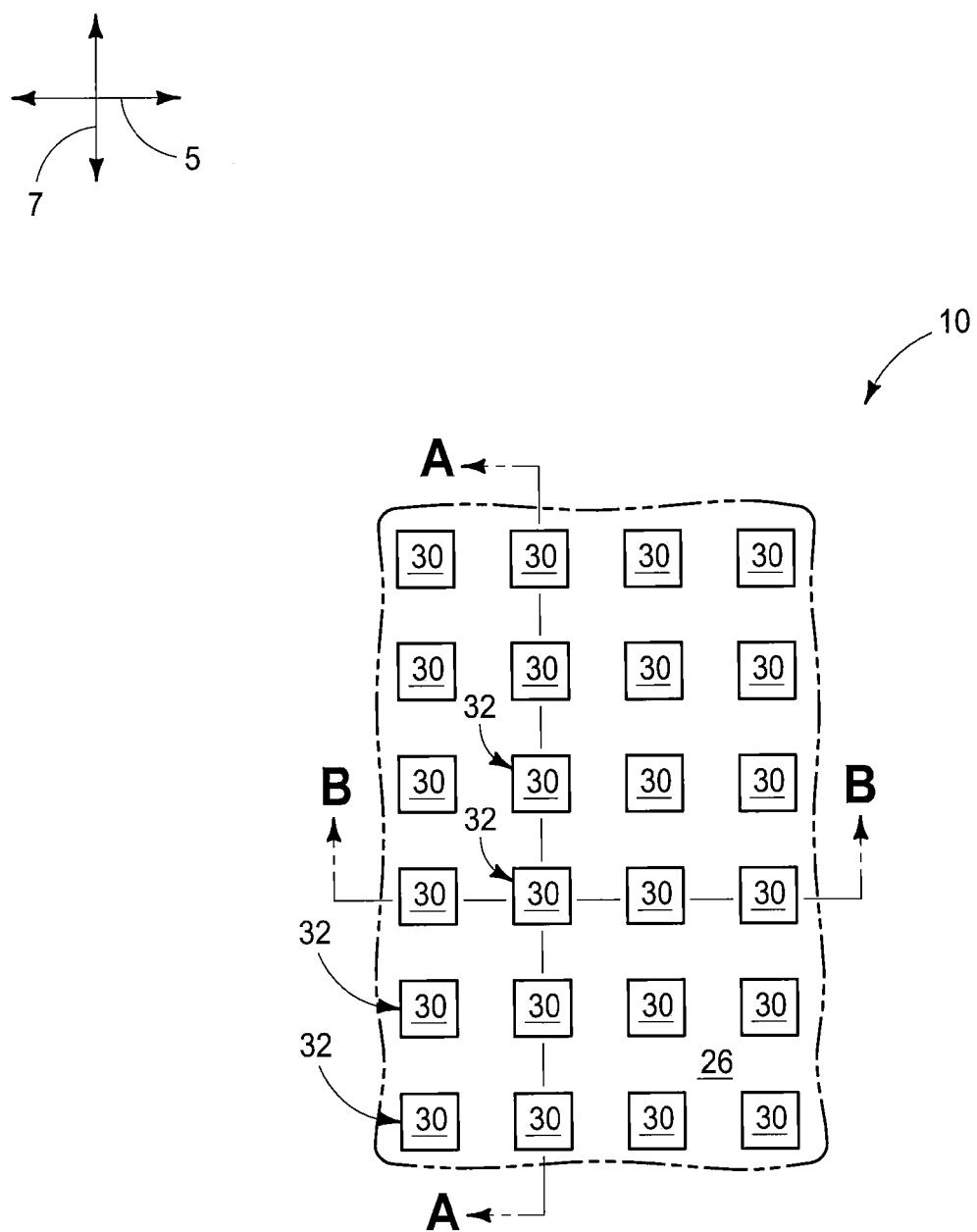
FIGS. 7-9 are a top view and cross-sectional side views of a construction at an example processing stage subsequent to that of FIGS. 4-6. The cross-sectional views of FIGS. 8 and 9 are along the lines A-A and B-B, respectively, of FIG. 7.
Figure 8:
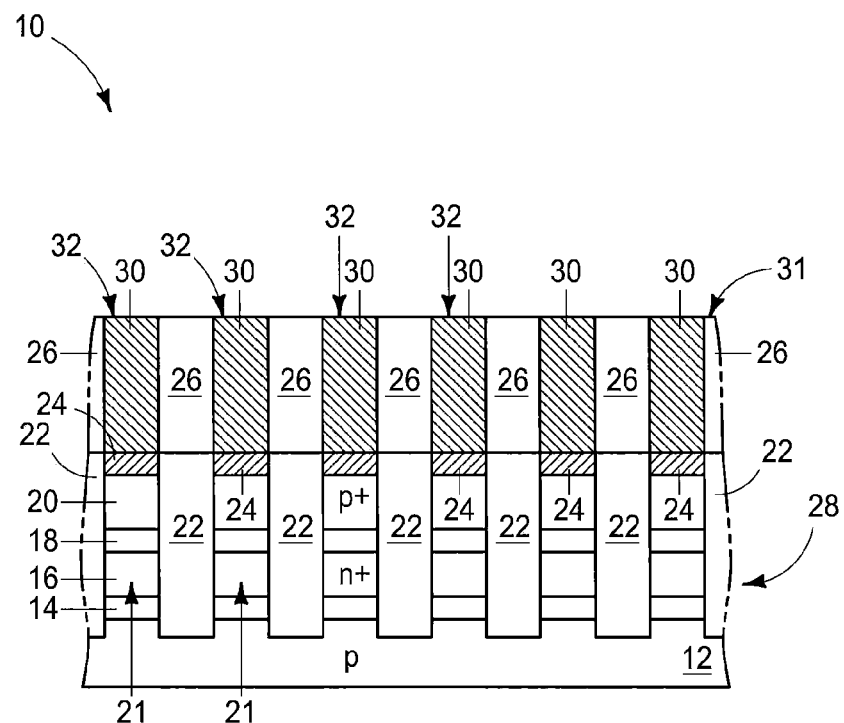
Figure 9:
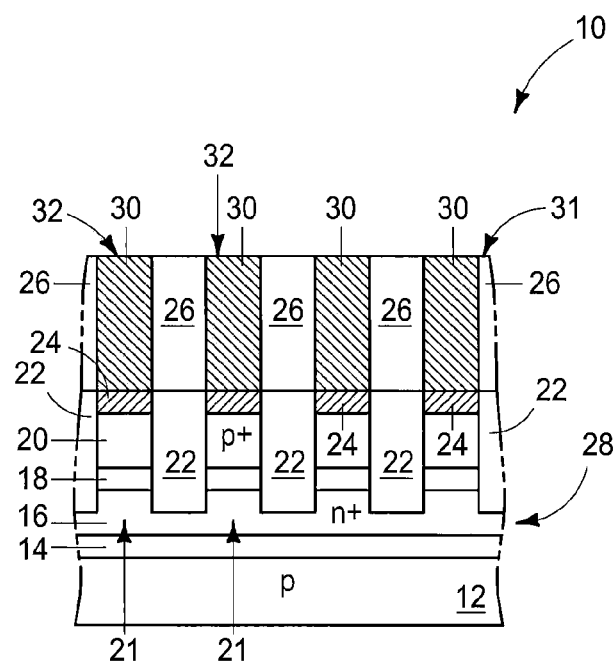

Referring to FIGS. 7-9, electrically insulative material 26 is formed across construction 10, and subsequently openings are formed through material 26 to conductive material 24 and filled with a conductive material 30.

The conductive material 30 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In an example embodiment, material 30 may comprise a liner of titanium nitride around a fill of tungsten.

The insulative material 26 may comprise any suitable composition or combination of compositions. In some embodiments, material 26 may comprise a same composition as material 22, and accordingly material 26 may comprise an oxygen-containing composition, such as, for example, one or more of silicon dioxide, BPSG, PSG, etc. In some embodiments material 26 may comprise a different composition than material 22.

A planarized surface 31 is shown extending across materials 30 and 26. Such surface may result from chemical-mechanical polishing (CMP). For instance, material 30 may be initially provided to overfill the openings within material 26, and subsequently CMP may be utilized to remove excess material 30 and form the shown planarized surface 31.

The material 30 may be considered to form a plurality of conductive plugs, with upper regions of the conductive plugs corresponding to a plurality of spaced-apart electrical nodes 32 (only some of which are labeled) across the top of construction 10.

The electrical nodes are arranged in the grid comprising the first direction along axis 5 and the second direction along axis 7.

Figure 10:
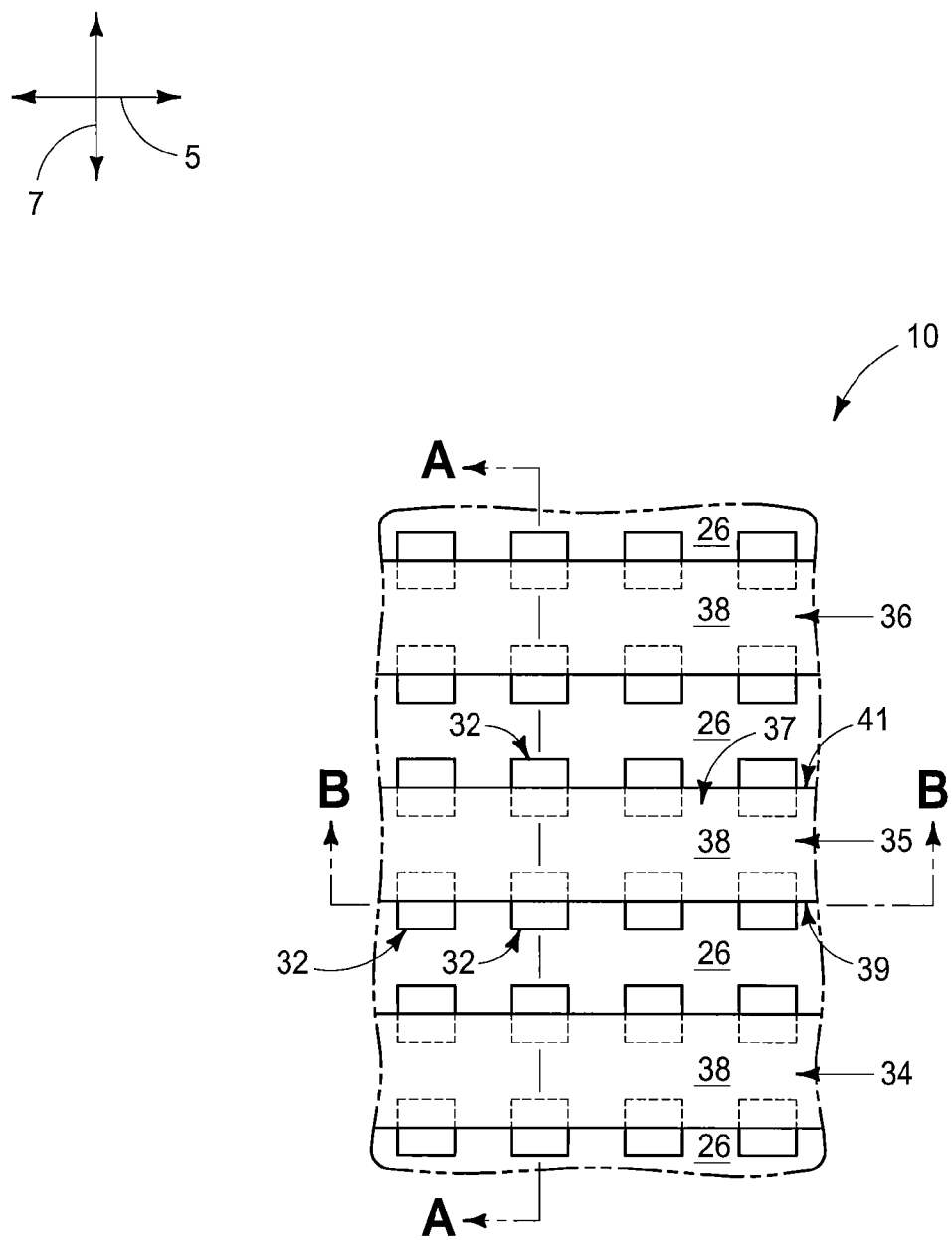
FIGS. 10-12 are a top view and cross-sectional side views of a construction at an example processing stage subsequent to that of FIGS. 7-9. The cross-sectional views of FIGS. 11 and 12 are along the lines A-A and B-B, respectively, of FIG. 10.
Figure 11:
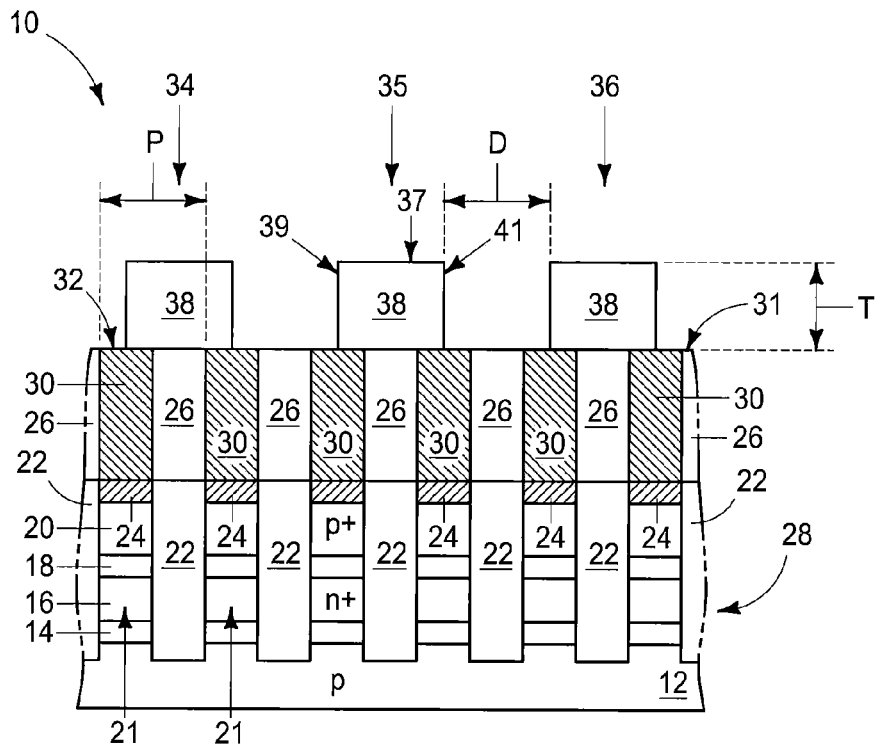
Figure 12:
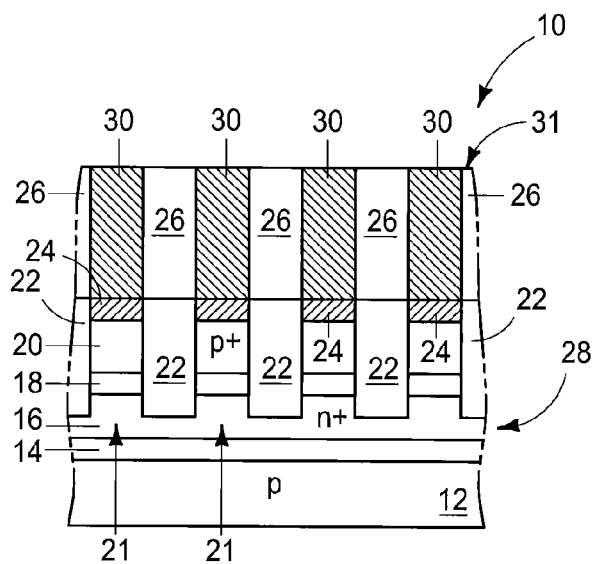

Referring to FIGS. 10-12, spaced-apart patterning structures 34-36 are formed over planarized surface 31. In the shown embodiment, the patterning structures are lines extending along the direction of axis 5. Each patterning structure comprises a top (for instance, the top 37 of structure 35) and a pair of opposing sidewalls (for instance, the sidewalls 39 and 41 of structure 35). In some embodiments, one of the sidewalls of a patterning structure may be referred to as a first sidewall and the other may be referred to as a second sidewall. Accordingly, in some embodiments sidewalls 39 and 41 may be referred to as a first sidewall and a second sidewall, respectively. The first sidewall 39 passes across and directly over one set of nodes, and the second sidewall 41 passes across and directly over a different set of nodes. In some embodiments, the nodes under the first sidewall may be referred to as a first set of nodes, and the nodes under the second sidewall may be referred to as a second set of nodes.

The patterning structures span spaces between the nodes 32 and partially overlap the nodes. Portions of the nodes are shown in dashed-line in the top view of FIG. 10 to indicate that such portions are under the patterning structures 34-36.

The patterning structures comprise a material 38. Such material may comprise any suitable composition, or combination of compositions; and in some embodiments may comprise, consist essentially of, or consist of silicon nitride.

The patterning structures 34-36 may comprise any suitable dimensions. In some embodiments, nodes 32 may be formed on a pitch P, and the patterning structures may be spaced from one another by a distance D comparable to such pitch. For instance, in some embodiments the pitch may be a dimension within a range of from about 40 nanometers to about 60 nanometers, and D may be substantially the same dimension. The patterning structures have a thickness T. In some embodiments, such thickness may be within a range of from about equal to the pitch to about three-times the pitch; and in some example embodiments may be within a range of from about 60 nanometers to about 100 nanometers.

The patterning structures may be formed with any suitable processing; including, for example, forming a layer of material 38 across planarized surface 31 followed by utilization of a patterned mask (not shown) and one or more etches to form the illustrated lines of material 38. The patterned mask may comprise any suitable mask, including, for example, a photolithographically-patterned photoresist mask and/or a mask formed utilizing pitch-modification methodologies.

Figure 13:
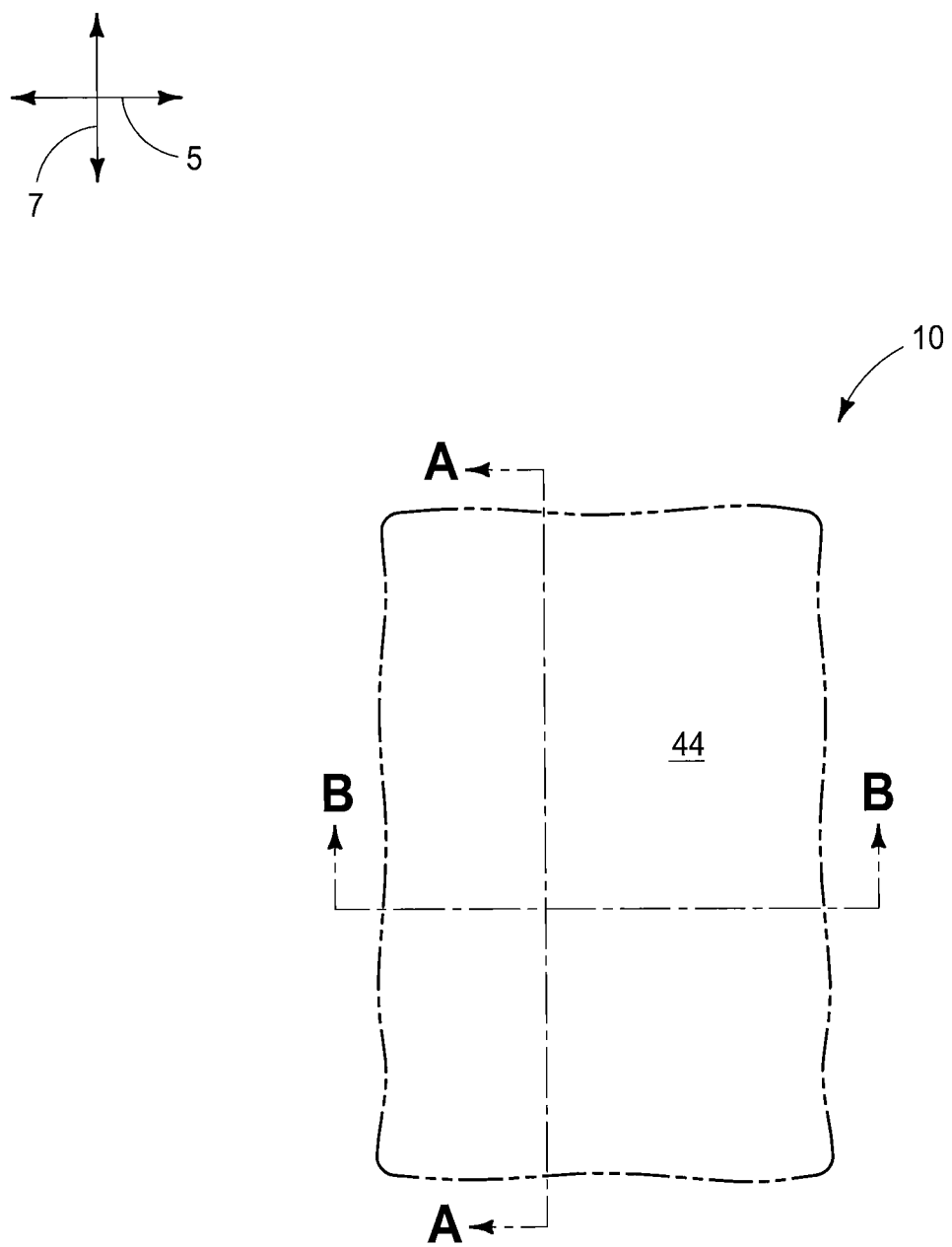
FIGS. 13-15 are a top view and cross-sectional side views of a construction at an example processing stage subsequent to that of FIGS. 10-12. The cross-sectional views of FIGS. 14 and 15 are along the lines A-A and B-B, respectively, of FIG. 13.
Figure 14:
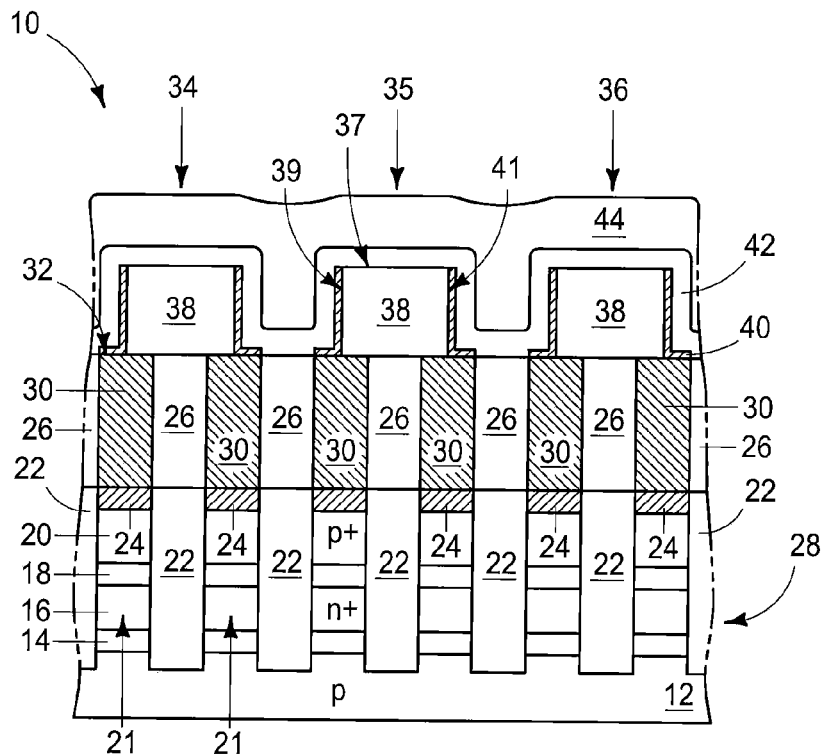
Figure 15:
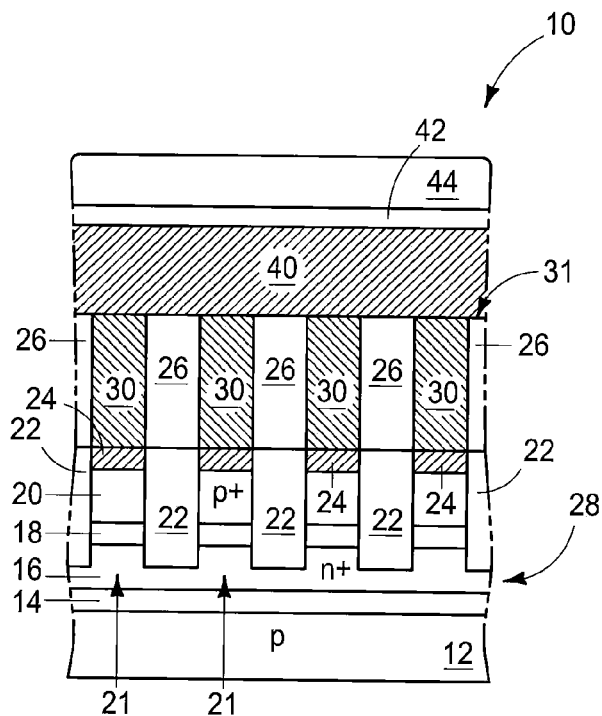

Referring to FIGS. 13-15, heater material 40 is formed along sidewalls of the patterning structures 34-36, and dielectric materials 42 and 44 are formed across the heater material 40. The heater material 40 is shown to be patterned to be angled plates that extend along the sidewall surfaces of the patterning structures (for instance, surfaces 37 and 39 of structure 35), and that extend across upper regions of nodes 32. The heater material may be patterned into such configuration with any suitable methodology. For instance, in some embodiments the heater material may be formed to extend conformally across the patterning structures 34-36 and the spaces between the patterning structures, and then the heater material may be patterned utilizing a mask (not shown) and one or more etches to form the heater material into the configuration shown in FIGS. 14 and 15. The dielectric material 42 is shown formed across the heater material. In some embodiments, the entirety of dielectric material 42 may be formed after patterning the heater material into the shown configuration of FIGS. 14 and 15. In other embodiments, some of the dielectric material may be formed prior to patterning the heater material, and patterned with the heater material; and then a remainder of dielectric material 42 may be formed.

The heater material 40 may have any suitable thickness, and in some embodiments may have a thickness within a range of from about 5 nanometers to about 10 nanometers. The heater material may comprise any suitable composition or combination of compositions. In some embodiments, the heater material may comprise titanium and nitrogen; and may be, for example, TiN, a TiN composite, doped TiN, etc. In some embodiments, the heater material may comprise TiSiN (where the formula indicates the components within the listed compound, rather than designating a specific stoichiometry of such components). The heater material may be formed with any suitable processing, including, for example, one or more of atomic layer deposition (ALD), chemical vapor deposition (CVD) and physical vapor deposition (PVD).

The dielectric material 42 may comprise any suitable composition or combination of compositions; and in some embodiments may comprise a non-oxygen-containing material; such as, for example, silicon nitride.

The dielectric material 44 may comprise any suitable composition or combination of compositions; and in some embodiments may comprise one or more of silicon dioxide, silicon nitride, etc.

Figure 16:
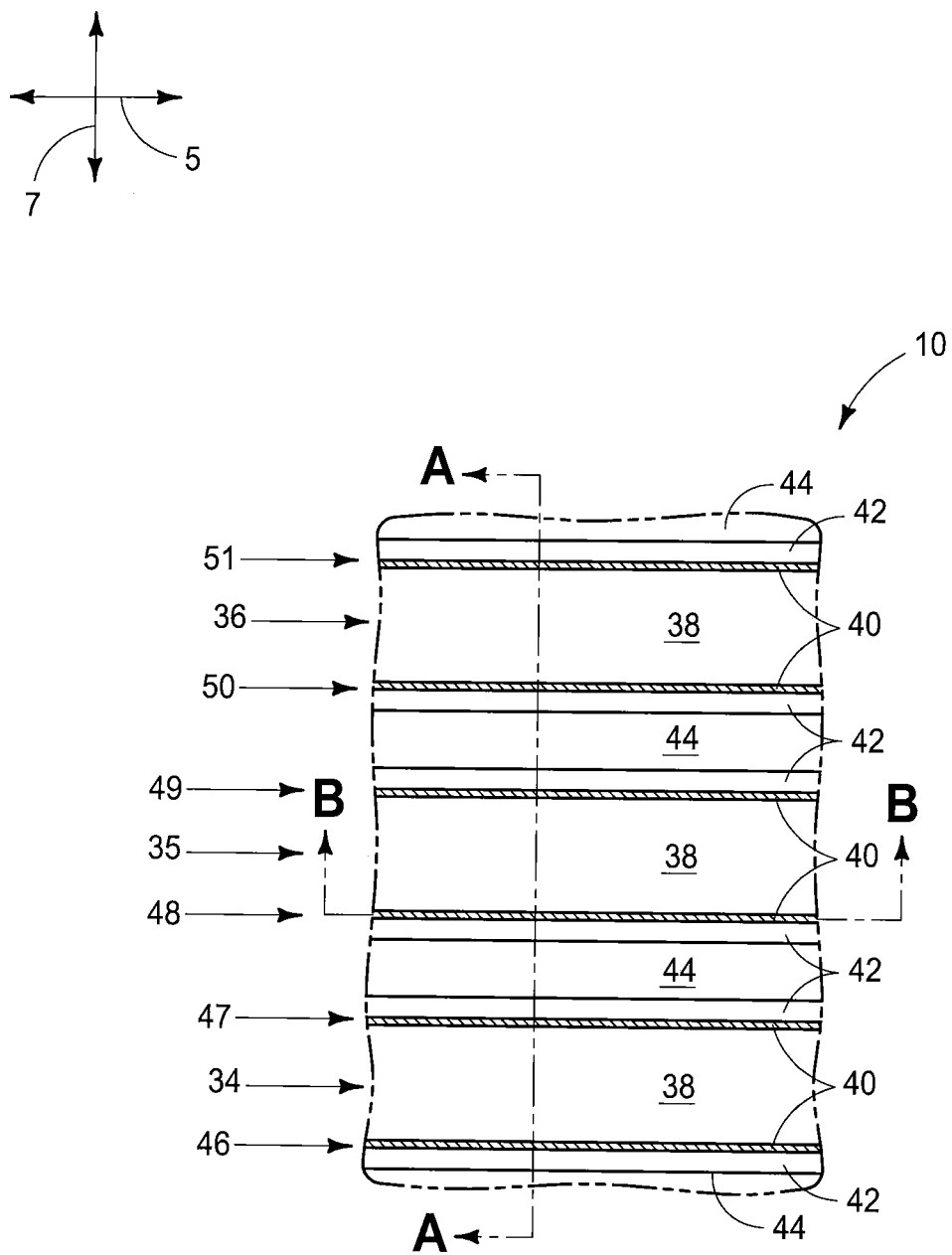
FIGS. 16-18 are a top view and cross-sectional side views of a construction at an example processing stage subsequent to that of FIGS. 13-15. The cross-sectional views of FIGS. 17 and 18 are along the lines A-A and B-B, respectively, of FIG. 16.
Figures 17, 18:
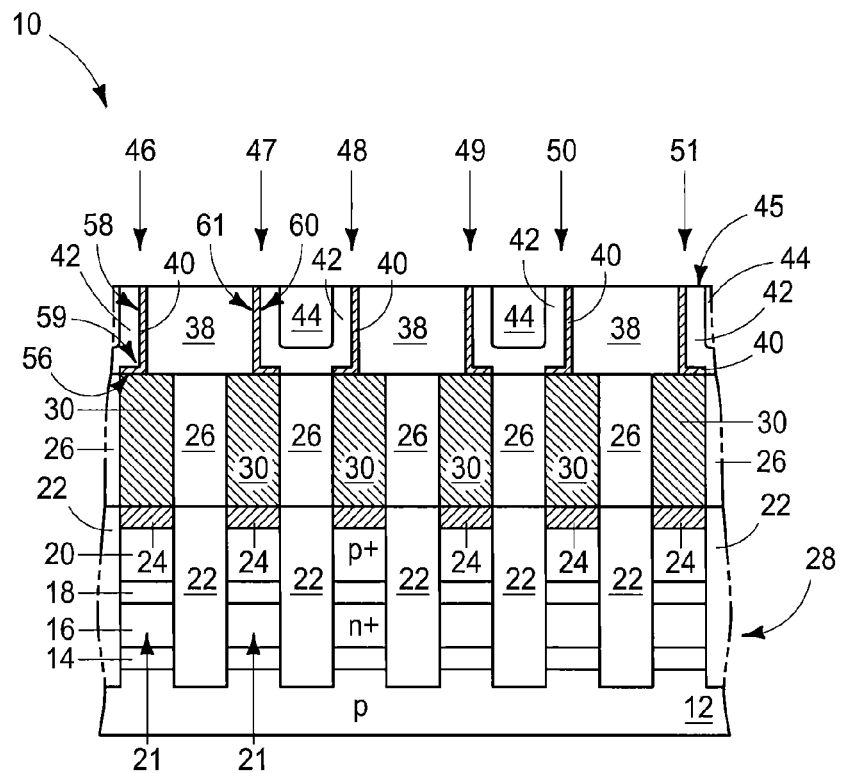

Referring to FIGS. 16-18, chemical-mechanical polishing (CMP) or other suitable planarization is utilized to remove materials 42 and 44 from over material 38 of patterning structures 34-36, and form the shown planarized surface 45.

In some embodiments, the construction of FIGS. 16-18 may be considered to comprise an arrangement of heater element material strips 46-51 which extend along a direction of axis 5. Each heater element strip extends across a plurality of underlying nodes 32, as shown in FIG. 18 where the strip 48 extends across several nodes 32.

The strips 46-51 are spaced from one another by intervening material corresponding to the dielectric materials 38, 42 and 44. The planarized surface 45 extends across the strips 46-51, and across the intervening material between such strips.

In the shown embodiment, each of the strips comprises a horizontal portion 56 (one of which is labeled in FIG. 17) and a non-horizontal portion 58 (one of which is labeled in FIG. 17). The horizontal portion is over and directly against an underlying node 32, and the non-horizontal portion extends upwardly from the horizontal portion at a corner 59 (one of which is labeled in FIG. 17). In the shown embodiment, the non-horizontal portions are substantially orthogonal to the horizontal portions, and accordingly the corners 59 are about 90°. In other embodiments, the corners 59 may have other angles.

In some embodiments, corners 59 may be referred to as inside corners, and each of the heater material strips 46-51 may be considered to comprise an interior sidewall 60 (one of which is labeled in FIG. 17) along the inside corner, and to comprise an exterior sidewall 61 (one of which is labeled in FIG. 17) in opposing relation to the interior sidewall.

Figure 19:
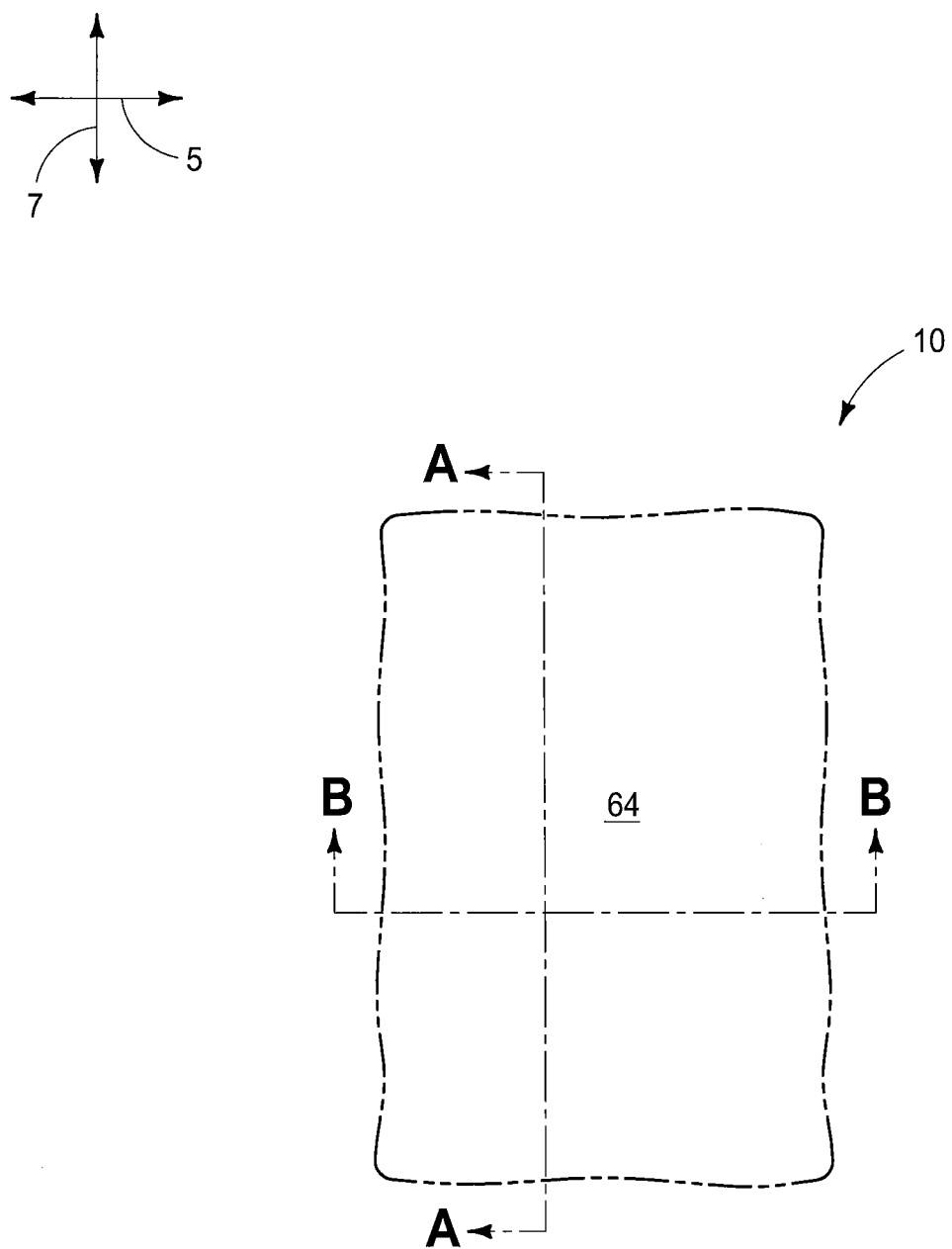
FIGS. 19-21 are a top view and cross-sectional side views of a construction at an example processing stage subsequent to that of FIGS. 16-18. The cross-sectional views of FIGS. 20 and 21 are along the lines A-A and B-B, respectively, of FIG. 19.
Figure 20:
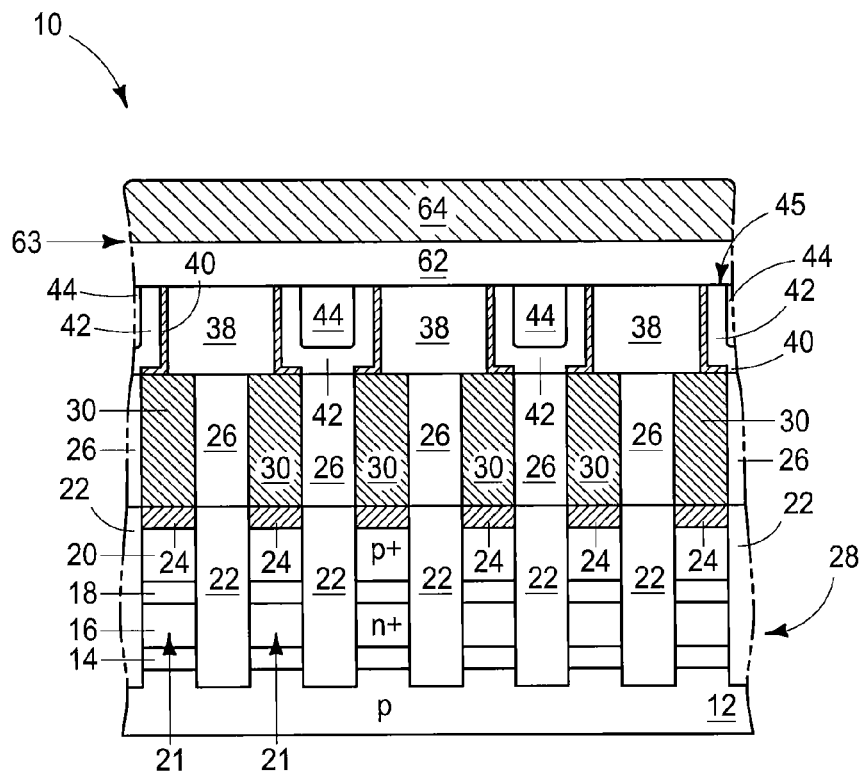
Figure 21:
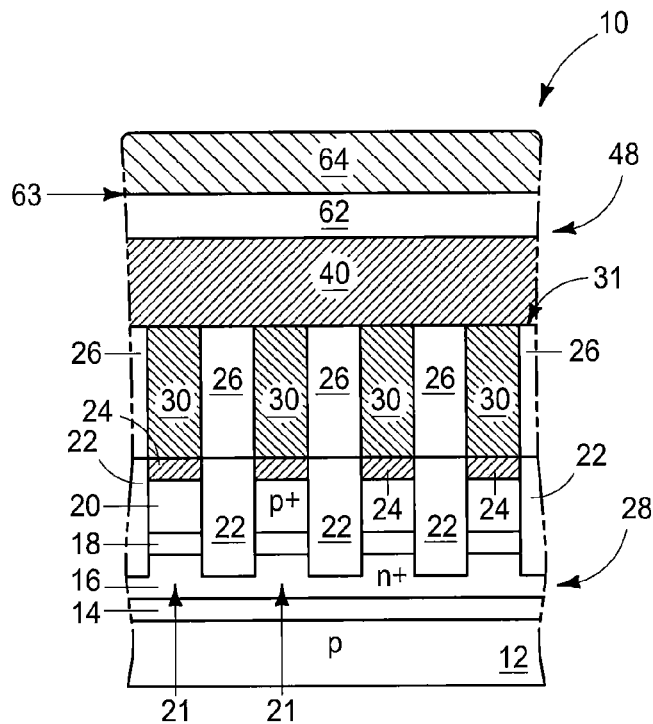

Referring to FIGS. 19-21, phase change material 62 is formed across the planarized surface 45. The phase change material may be of any suitable composition or combination of compositions. In some embodiments, the phase change material may comprise, consist essentially of, or consist of a chalcogenide; such as, for example, a mixture of germanium, antimony and tellurium (i.e., a mixture commonly referred to as GST). The phase change material is an example of an oxygen-sensitive material; with the term "oxygen-sensitive material" meaning a material which is altered in a non-desired manner upon exposure to oxygen. In some embodiments, processing described herein protects regions of the oxygen-sensitive material from exposure to oxygen. Such may alleviate or prevent oxygen-induced degradation of such regions of the oxygen-sensitive material. Although the example oxygen-sensitive material described herein is phase change material, in other embodiments analogous processing to that described herein may be utilized for other oxygen-sensitive materials.

The phase change material may be ultimately incorporated into memory cells as a programmable material, and thus may be referred to as programmable material in some embodiments. The regions of the programmable material that are protected from oxygen-induced degradation may be the regions that are within the memory cells. For instance, in the shown embodiment, some of the oxygen-sensitive material 62 is directly against dielectric material 42 and some is directly against dielectric material 44. In some embodiments, all regions of the dielectric material that are directly against the oxygen-sensitive material 62 will not comprise oxygen; and accordingly will be non-oxygen-containing material, such as silicon nitride. In some embodiments, it is recognized that material 42 is directly against regions of material 62 that are within memory cells and so material 42 is a non-oxygen-containing material; and it is recognized that material 44 is directly against regions of material 62 that are not within memory cells, and so it less important whether or not material 44 comprises oxygen. Thus material 44 may be a non-oxygen-containing material (e.g., silicon nitride), or may be an oxygen-containing material (e.g., silicon dioxide).

Electrode material 64 is formed over phase change material 62, and in the shown embodiment directly contacts the phase change material at an interface 63 (in other embodiments, there may be one or more additional materials between the phase change material and the electrode material). The electrode material may comprise, consist essentially of, or consist of carbon. Such carbon may be in any suitable form (e.g., graphene, etc.). The carbon-containing material 64 preferably contains little or no oxygen so that there will not be oxygen from the material 64 poisoning oxygen-sensitive material 62 within the memory cells. Carbon-containing material 64 may be formed to any suitable thickness; and in some embodiments may be formed to a thickness of from about 40 nanometers to about 200 nanometers. The carbon-containing material may be homogeneous (as shown), or may comprise two or more discrete compositions in a heterogeneous arrangement. In some embodiments, the carbon-containing material may comprise two or more layers of different composition relative to one another.

Figure 22:
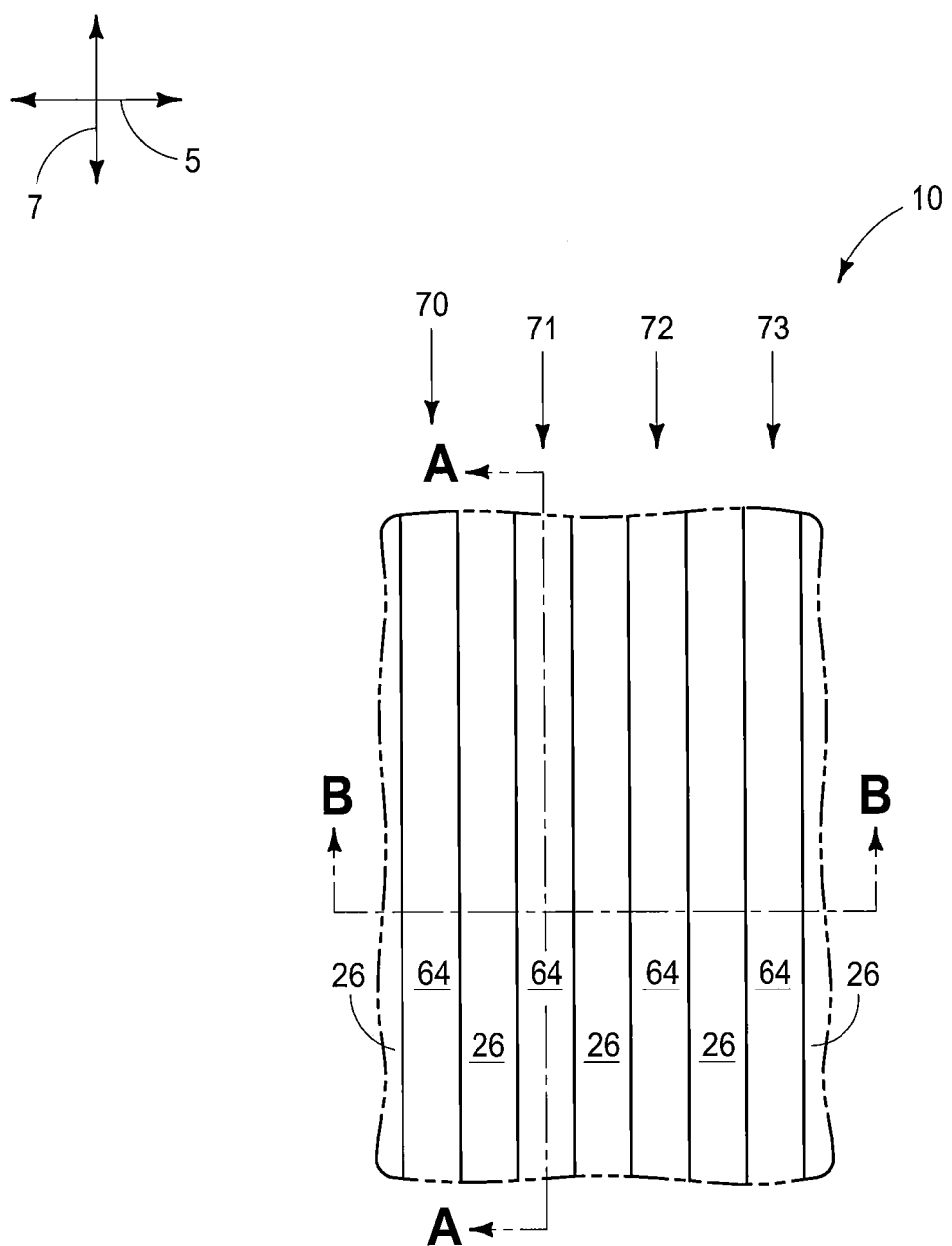
FIGS. 22-24 are a top view and cross-sectional side views of a construction at an example processing stage subsequent to that of FIGS. 19-21. The cross-sectional views of FIGS. 23 and 24 are along the lines A-A and B-B, respectively, of FIG. 22.
Figure 23:
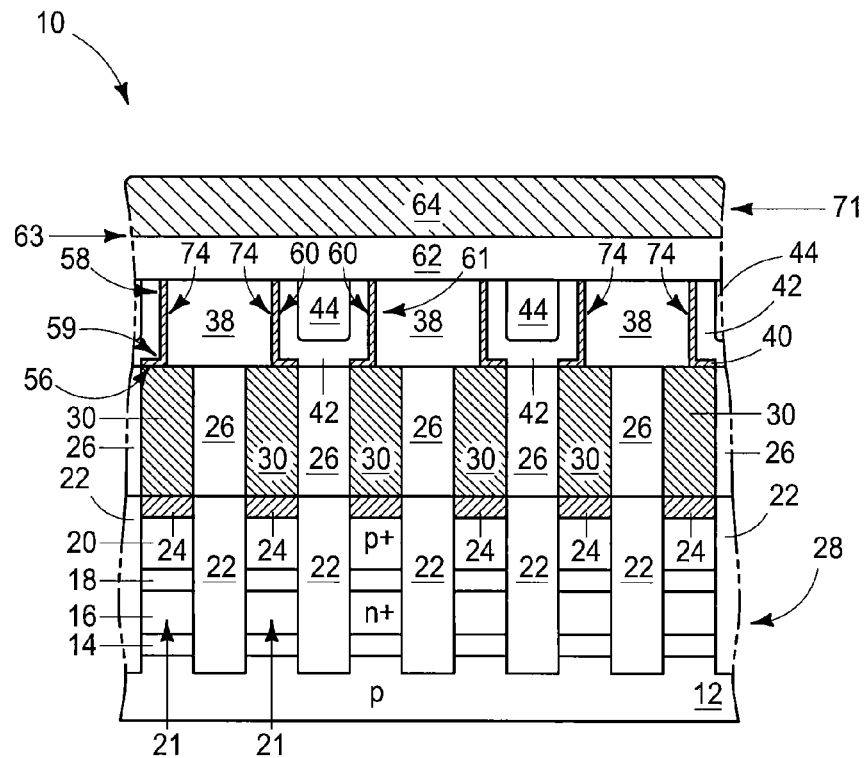
Figure 24:
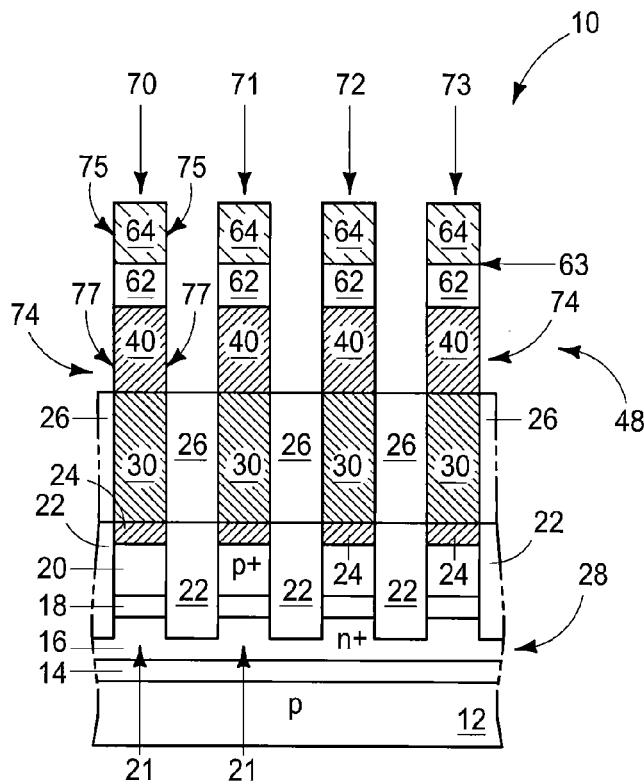

Referring to FIGS. 22-24, material 64 is patterned into a plurality of lines 70-73. The pattern of the lines is also transferred into materials 38, 40, 42, 44 and 62. Such etches the strips 46-51 (FIGS. 16-18) of heater material 40 into heater elements 74 that are in one-to-one correspondence with nodes 32 (for example, etches the line 48 of FIG. 21 into a plurality of heater elements 74 shown in FIG. 24).

In the shown embodiment, the lines 70-73 extend along the direction of axis 7, and thus are substantially orthogonal to the strips 46-51 (FIGS. 16-18). In other embodiments, the lines 70-73 may be formed along a direction which intersects the strips 46-51 (FIGS. 16-18), but which is not orthogonal to the strips.

FIG. 24 shows that the lines 70-73 have sidewalls 75 (only some of which are labeled) which extend upwardly from lateral edges 77 (only some of which are labeled) of the heater elements 74. The heater elements 74 are configured as angled plates comprising horizontal portions 56 (one of which is labeled in FIG. 23) joining to non-horizontal portions 58 (one of which is labeled in FIG. 23) through corners 59 (one of which is labeled in FIG. 23). Each heater element 74 comprises an interior sidewall 60 and an exterior sidewall 61 (the terms "exterior sidewall" and "interior sidewall" were described above with reference to FIGS. 16-18). The interior and exterior sidewalls extend to the lateral edges 77 of FIG. 24; and in some embodiments such lateral edges may be considered to bridge the interior sidewalls to the exterior sidewalls.

The phase change programmable material 62 and carbon-containing electrode material 64 are comprised by electrode/programmable lines 70-73 at the processing stage of FIGS. 22-24. Such lines extend across the heater elements 74. Accordingly, each of the heater structures 74 may be incorporated into a separate memory cell, with individual memory cells comprising a heater element in combination with the programmable material 62 and electrode material 64 directly above the element in the shown embodiment. In some embodiments, memory cell structures containing regions of the electrode/programmable material lines 70-73 together with the heater elements 74 may be considered to have sidewalls 75/77 that extend along the heater element material 40, the phase change material 62 and the carbon-containing material 64.

Figure 25:
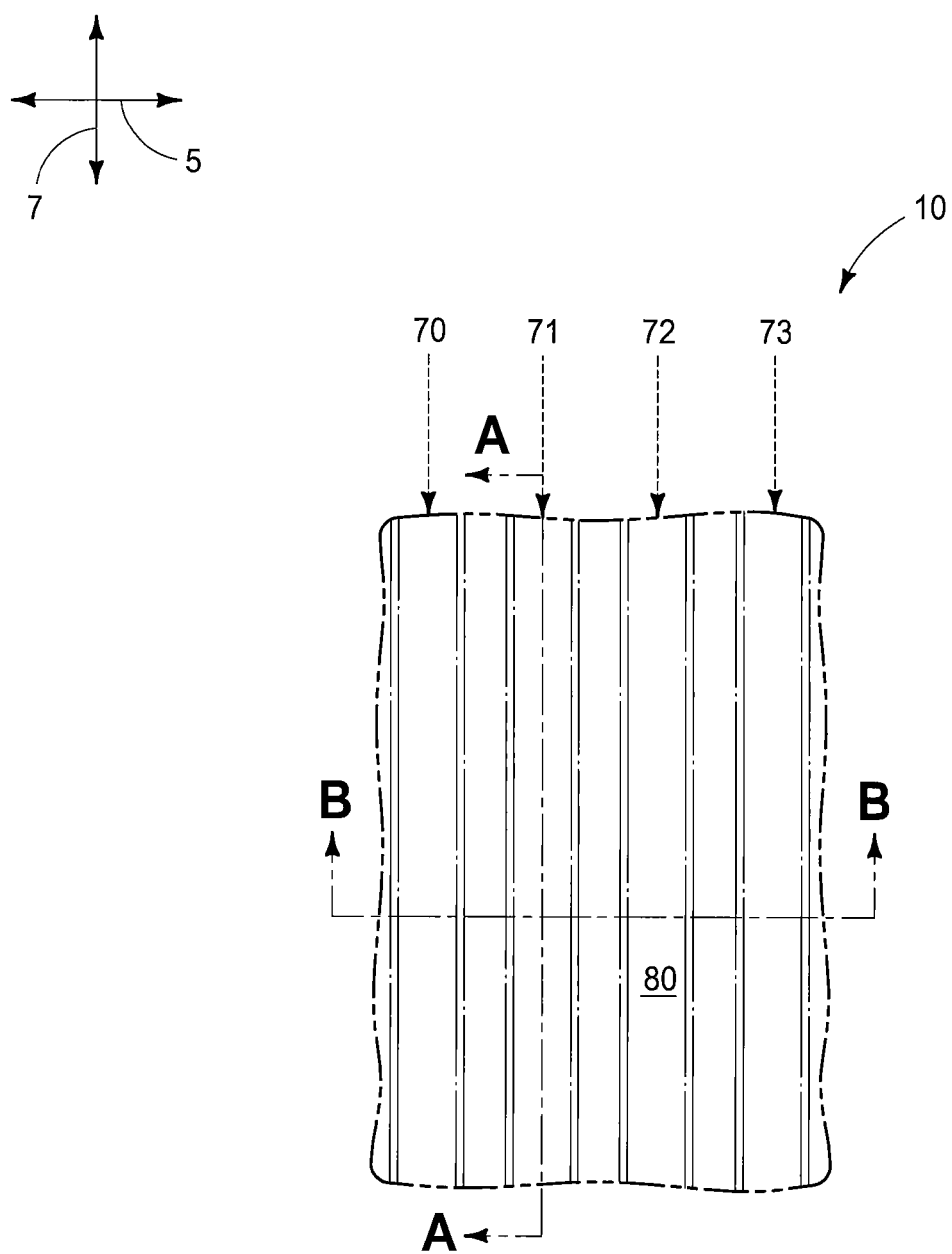
FIGS. 25-27 are a top view and cross-sectional side views of a construction at an example processing stage subsequent to that of FIGS. 22-24. The cross-sectional views of FIGS. 26 and 27 are along the lines A-A and B-B, respectively, of FIG. 25.
Figure 26:
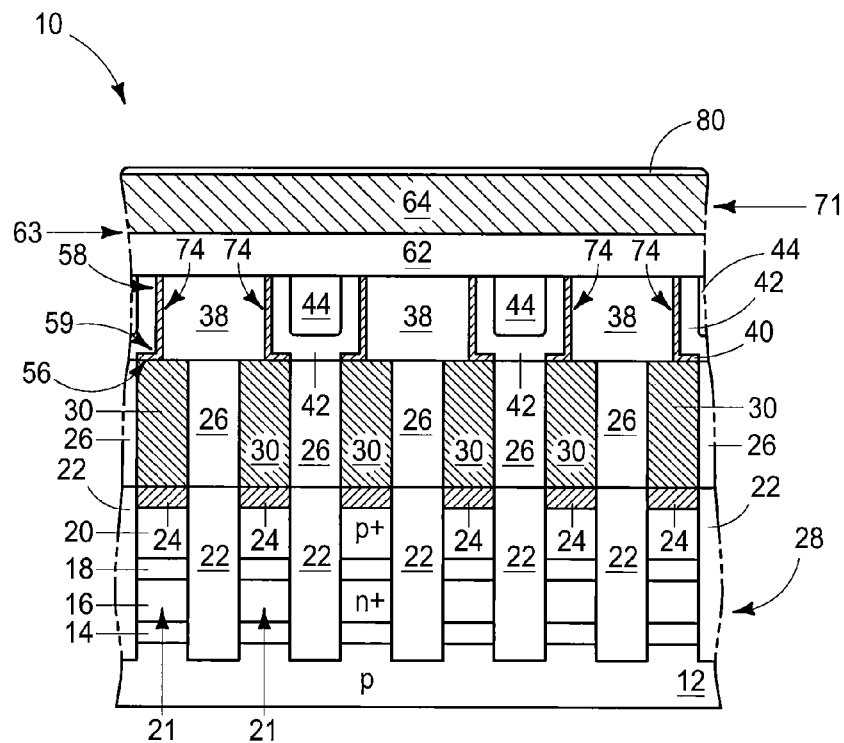
Figure 27:
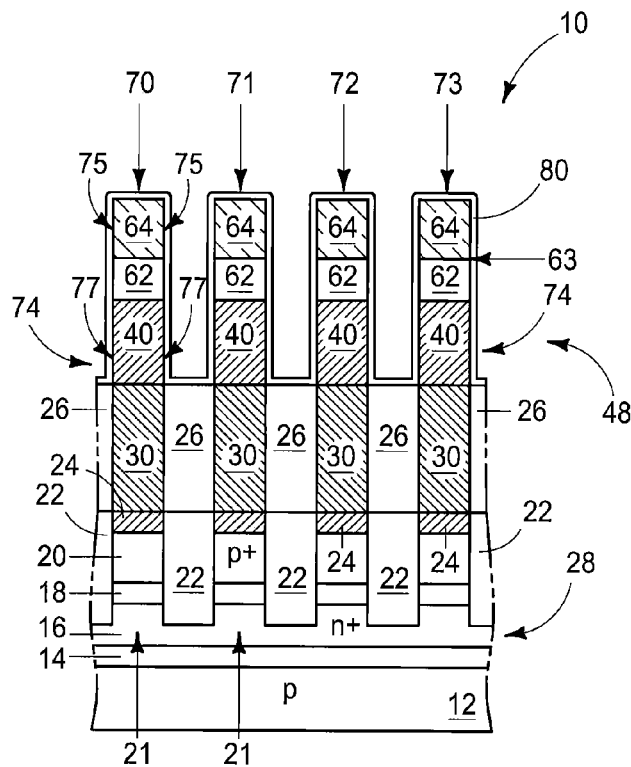

Referring to FIGS. 25-27, protective material 80 is formed over and between lines 70-73. Material 80 may comprise any suitable non-oxygen-containing composition or combination of compositions. In some embodiments, material 80 may comprise, consist essentially of, or consist of silicon nitride. Material 80 may be formed with any suitable processing, including, for example, one or more of ALD, CVD and PVD. In some embodiments, the material 80 may have a thickness within a range of from about 5 nanometers to about 10 nanometers.

Figure 28:
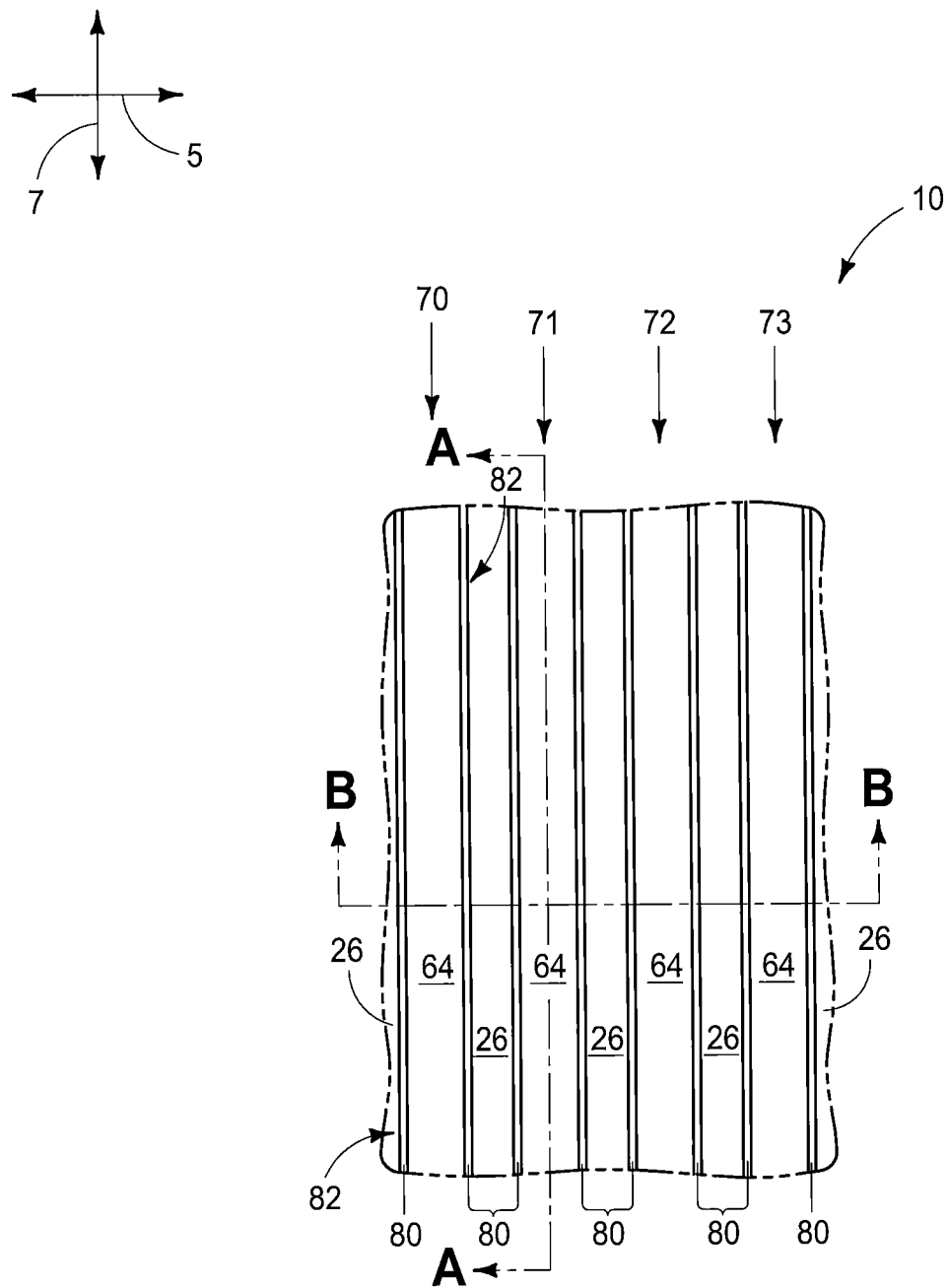
FIGS. 28-30 are a top view and cross-sectional side views of a construction at an example processing stage subsequent to that of FIGS. 25-27. The cross-sectional views of FIGS. 29 and 30 are along the lines A-A and B-B, respectively, of FIG. 28.
Figure 29:
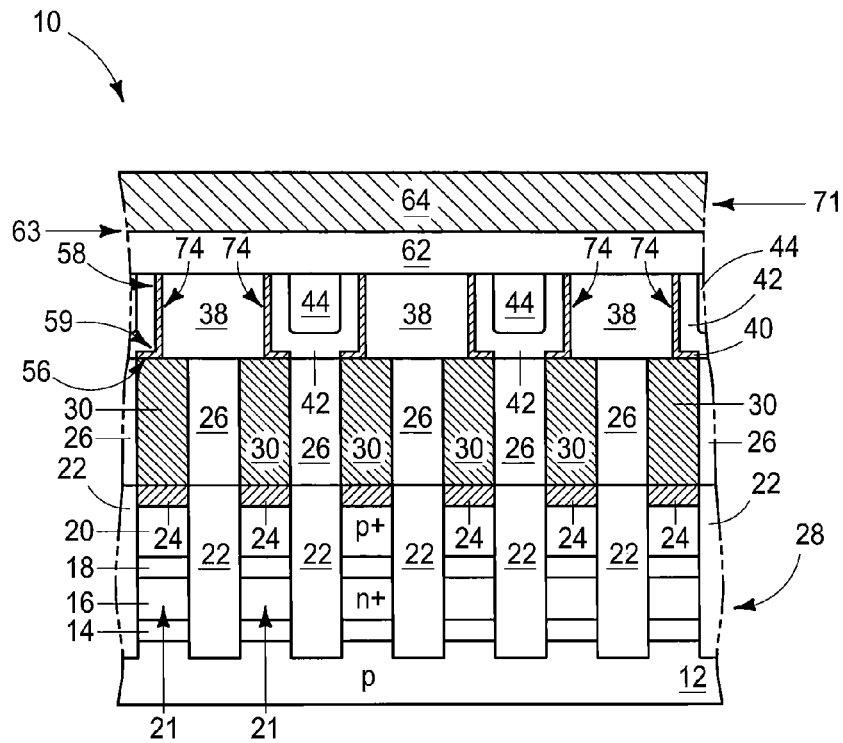
Figure 30:
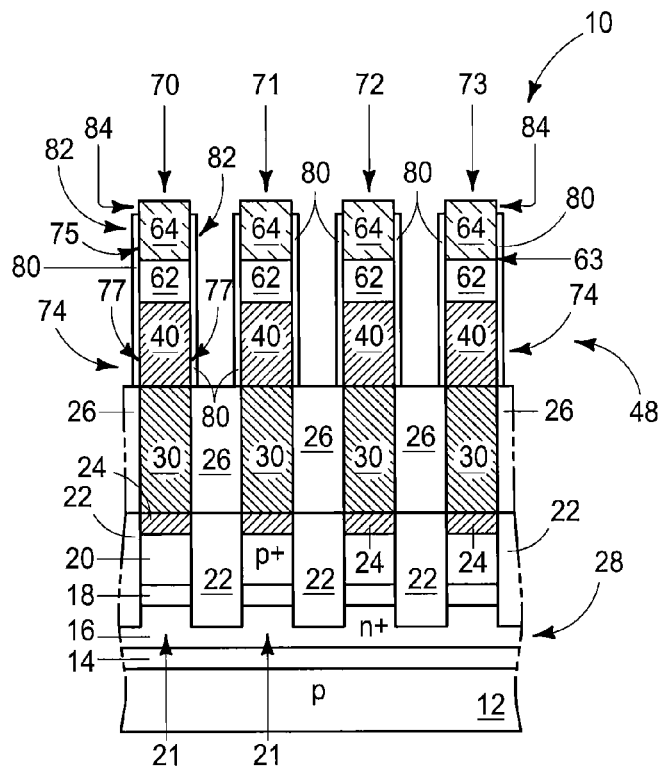

Referring to FIGS. 28-30, material 80 is anisotropically etched to pattern the material into spacers 82 (only some of which are labeled) that extend along the sidewalls 75/77. The anisotropic etching removes material 80 from along top regions 84 (only some of which are labeled in FIG. 30) of lines 70-73, while leaving the protective material across interfaces 63 where phase change material 62 contacts carbon-containing material 64.

Figure 31:
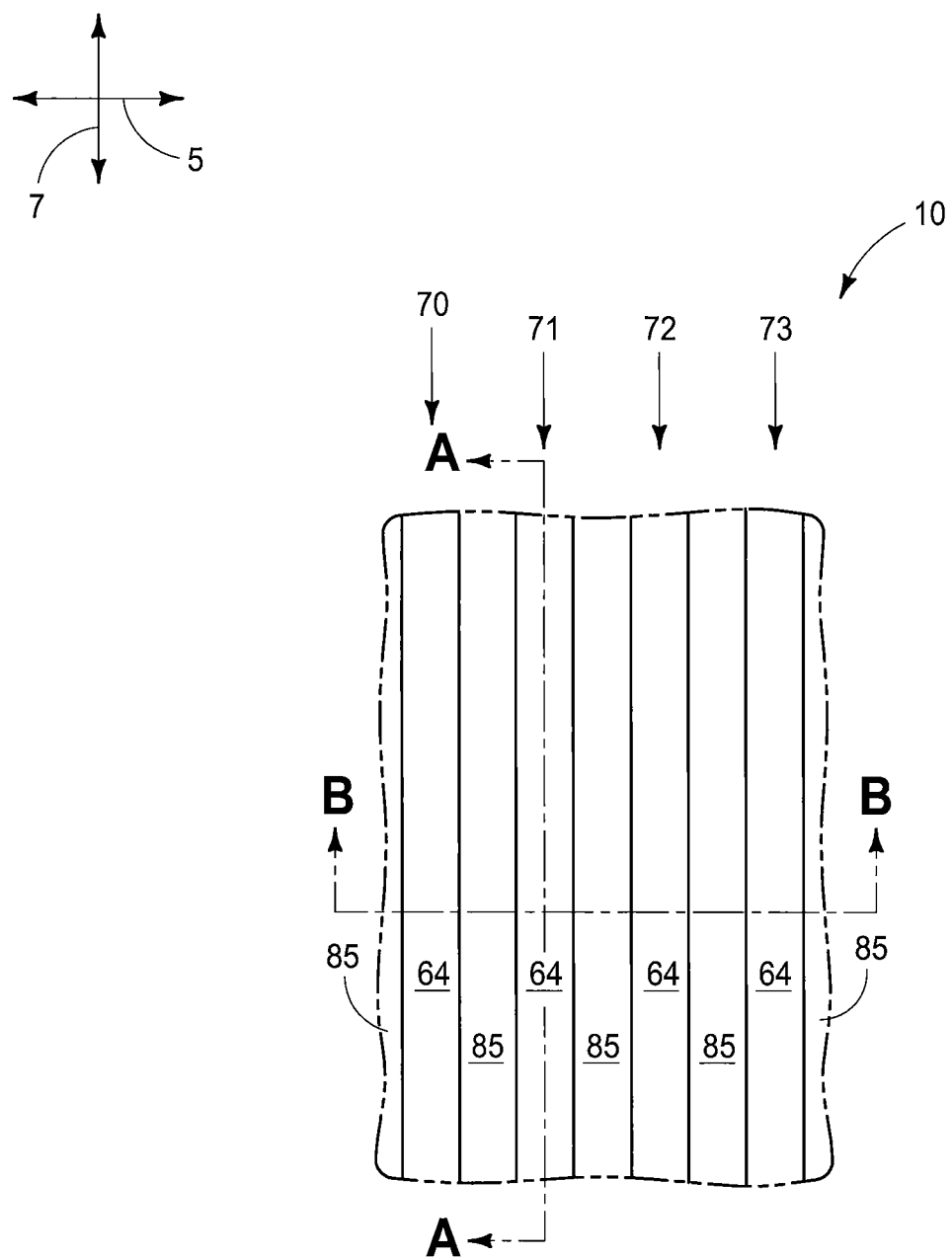
FIGS. 31-33 are a top view and cross-sectional side views of a construction at an example processing stage subsequent to that of FIGS. 28-30. The cross-sectional views of FIGS. 32 and 33 are along the lines A-A and B-B, respectively, of FIG. 31.
Figure 32:
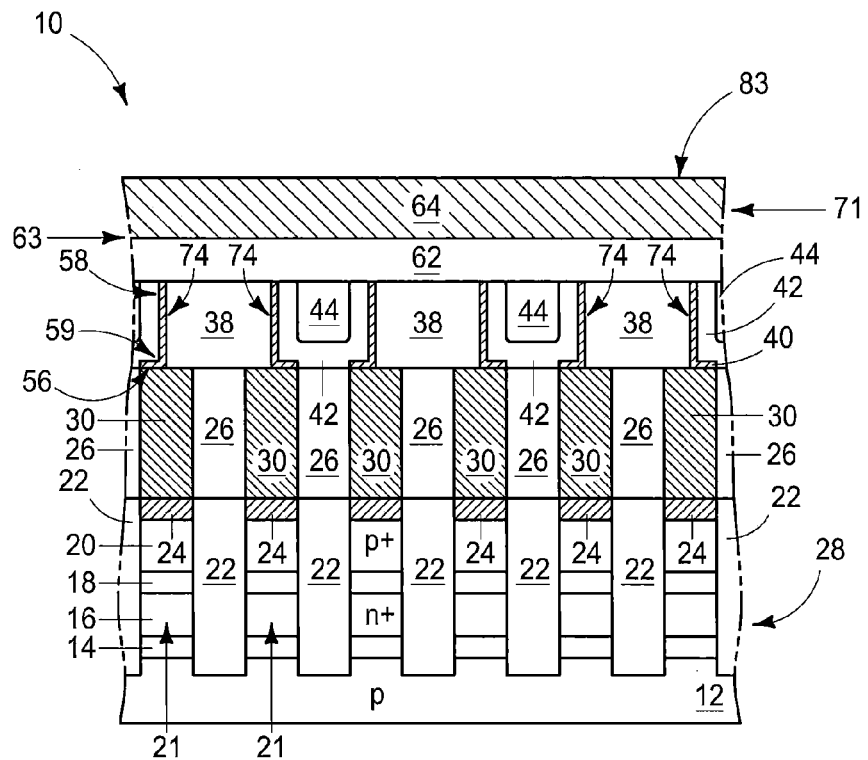
Figure 33:
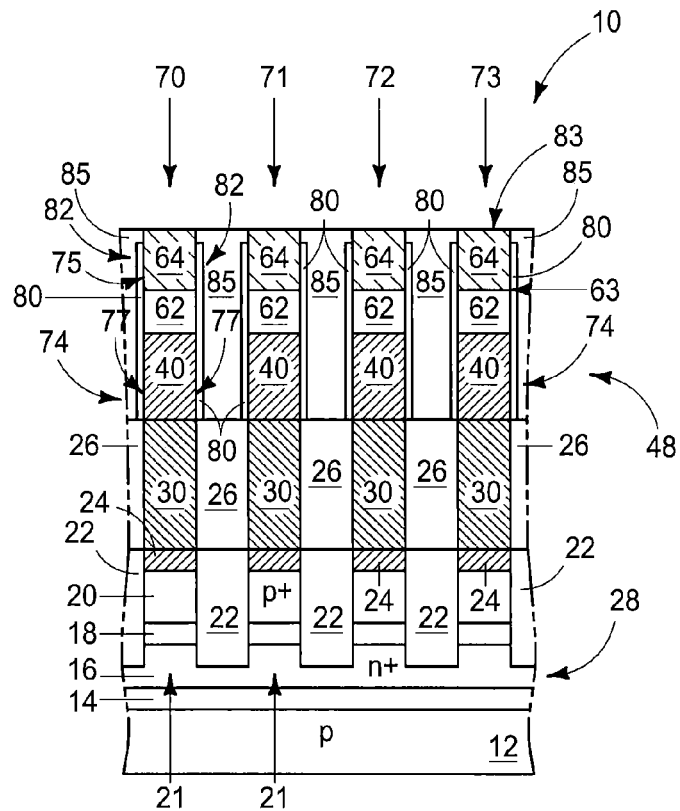

Referring to FIGS. 31-33, dielectric material 85 is formed between lines 70-73 and over material 80. The dielectric material 85 may comprise any suitable composition or combination of compositions, and in some embodiments may be an oxygen-containing material. For instance, in some embodiments material 85 may comprise one or more of silicon dioxide, BPSG, PSG, aluminum oxide, etc.

The dielectric material 85 may be initially formed to fill gaps between lines 70-73 and to extend across the lines 70-73. Subsequently, CMP or other appropriate processing may be utilized to remove the dielectric material from over lines 70-73 and form the shown planarized surface 83 extending across materials 85 and 64.

Figure 34:
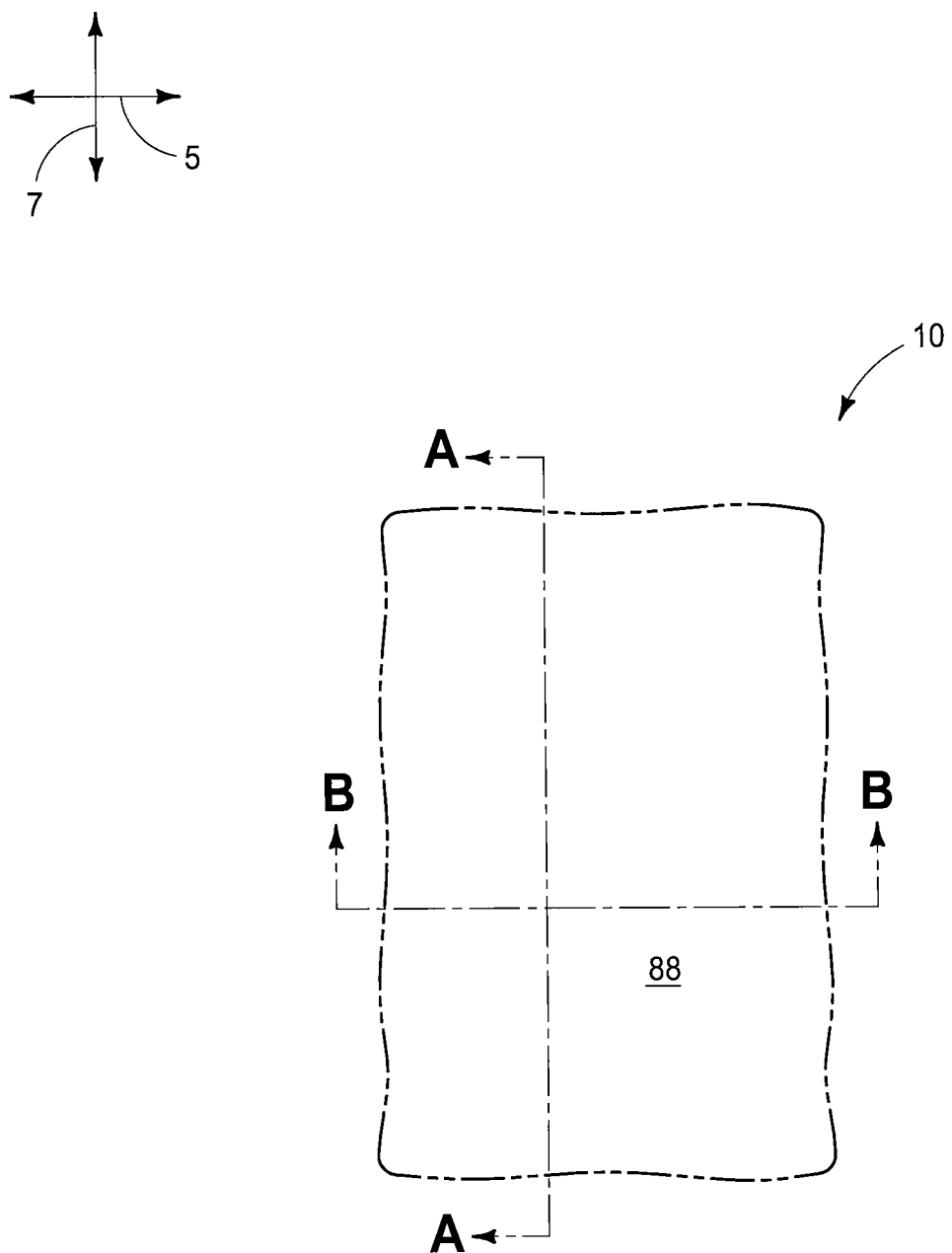
FIGS. 34-36 are a top view and cross-sectional side views of a construction at an example processing stage subsequent to that of FIGS. 31-33. The cross-sectional views of FIGS. 35 and 36 are along the lines A-A and B-B, respectively, of FIG. 34.
Figure 35:
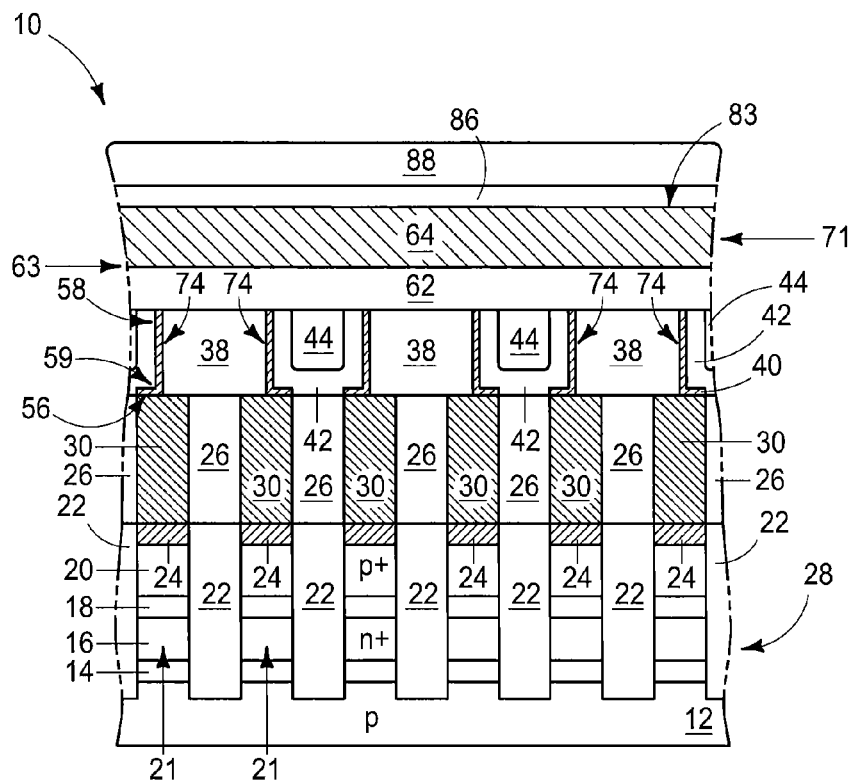
Figure 36:
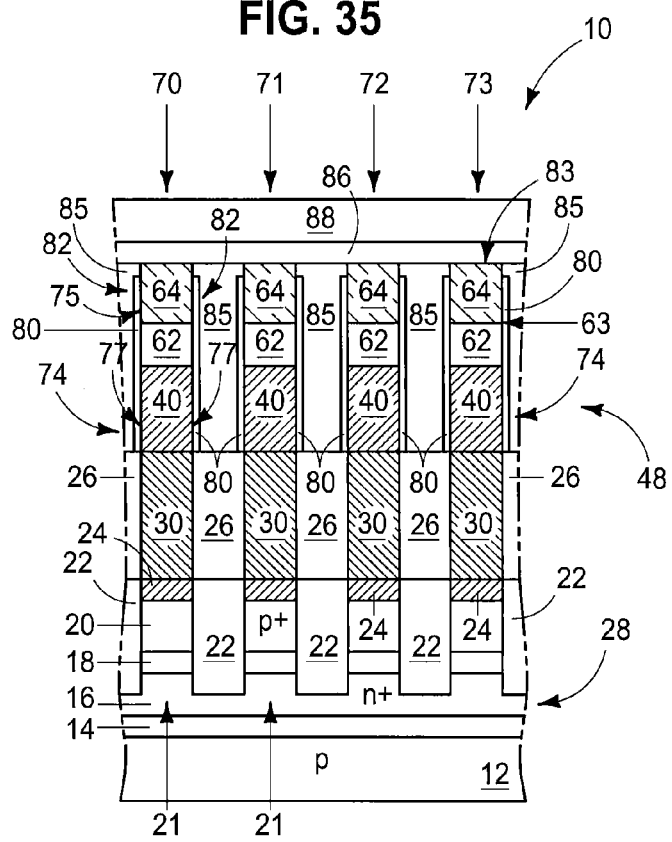

Referring to FIGS. 34-36, protective material 86 is formed over planarized surface 83, and dielectric material 88 is formed over the protective material.

Protective material 86 may be a non-oxygen-containing material; and may, for example, comprise, consist essentially of, or consist of silicon nitride. The protective material 86 may be referred to as a second protective material to distinguish it from the first protective material 80. In some embodiments, the protective materials 80 and 86 may comprise a same composition as one another, and in other embodiments they may comprise different compositions relative to one another.

The protective material 86 may be formed to any suitable thickness, and in some embodiments may be formed to a thickness within a range of from about 20 nanometers to about 40 nanometers.

The dielectric material 88 may comprise any suitable composition or combination of compositions, and in some embodiments may comprise oxygen-containing material. For instance, in some embodiments dielectric material 88 may comprise silicon dioxide, BPSG, PSG, aluminum oxide, etc.

Figure 37:
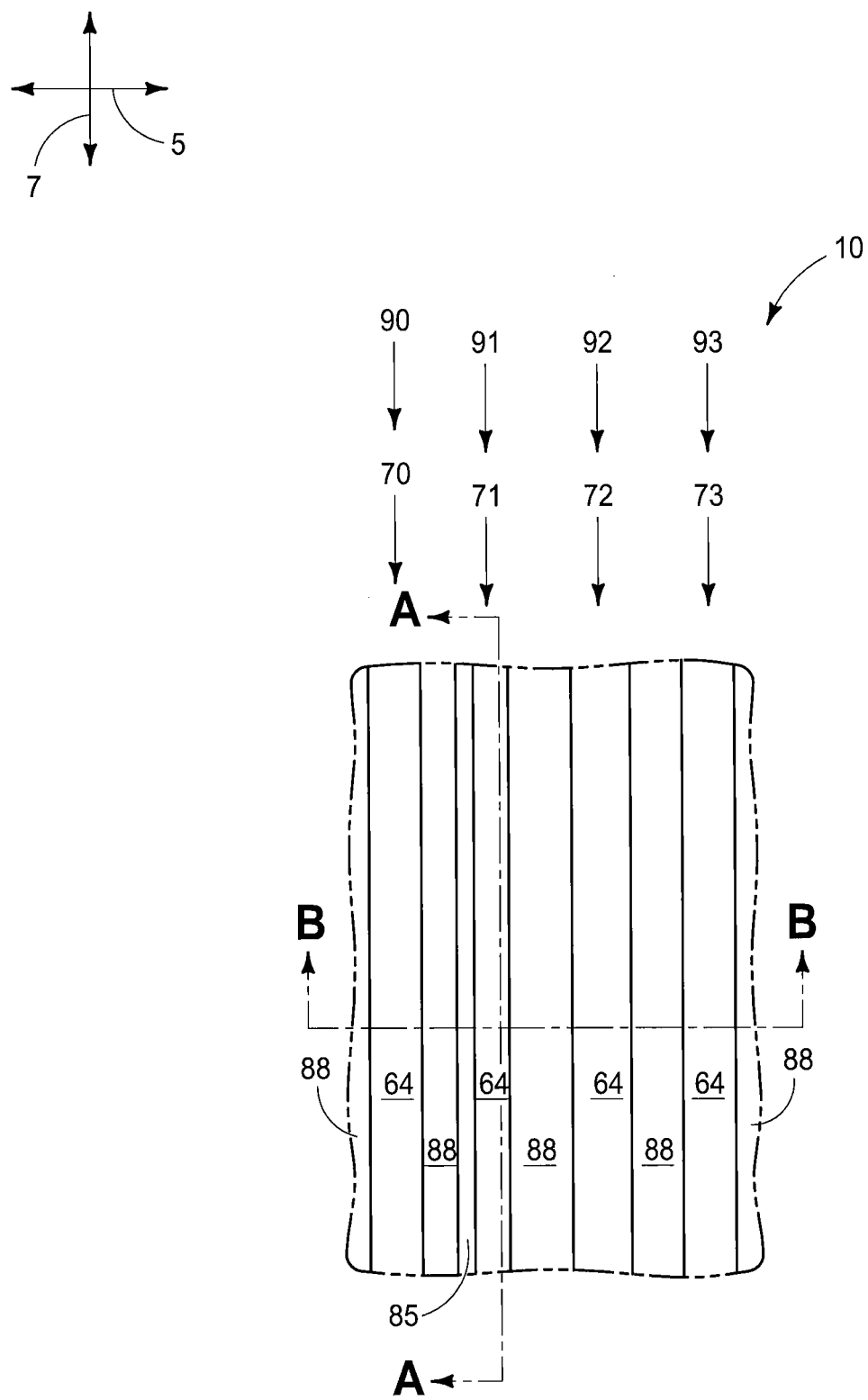
FIGS. 37-39 are a top view and cross-sectional side views of a construction at an example processing stage subsequent to that of FIGS. 34-36. The cross-sectional views of FIGS. 38 and 39 are along the lines A-A and B-B, respectively, of FIG. 37.
Figure 38:
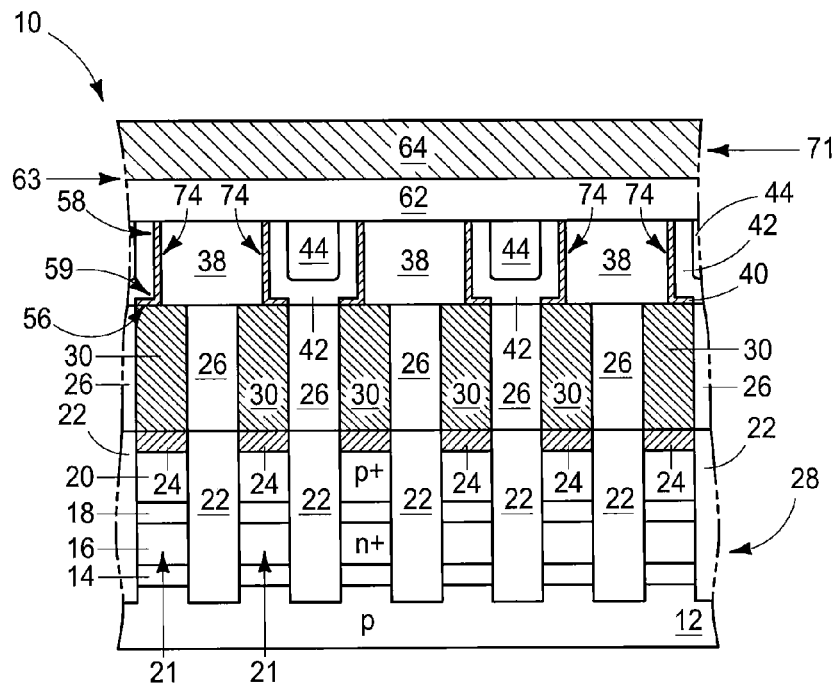
Figure 39:
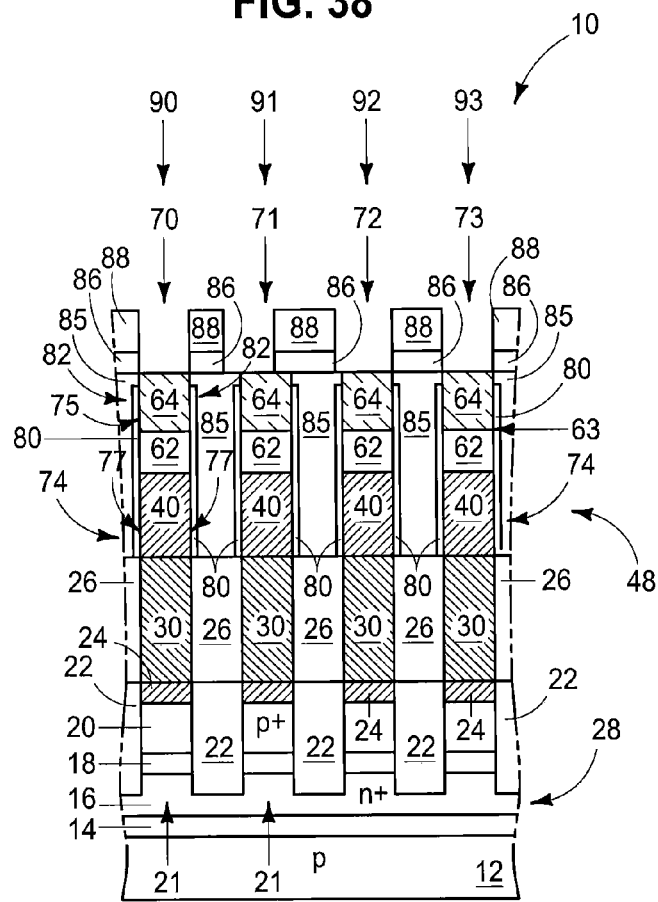

Referring to FIGS. 37-39, trenches 90-93 are etched through materials 86 and 88 to expose carbon-containing material 64 of lines 70-73. In the shown embodiment, trenches 90, 92 and 93 are aligned with lines 70, 71 and 73, respectively; and trench 91 is misaligned relative to the underlying line 71. The misaligned trench 91 exposes the dielectric material 85 adjacent line 71. However, the problem described above with reference to FIG. 3 is avoided due to dielectric material 85 having a different composition than protective material 86. Specifically, the etching utilized to penetrate material 86 and form misaligned trench 91 stops at dielectric material 85, rather than penetrating along the side of line 71.

Figure 40:
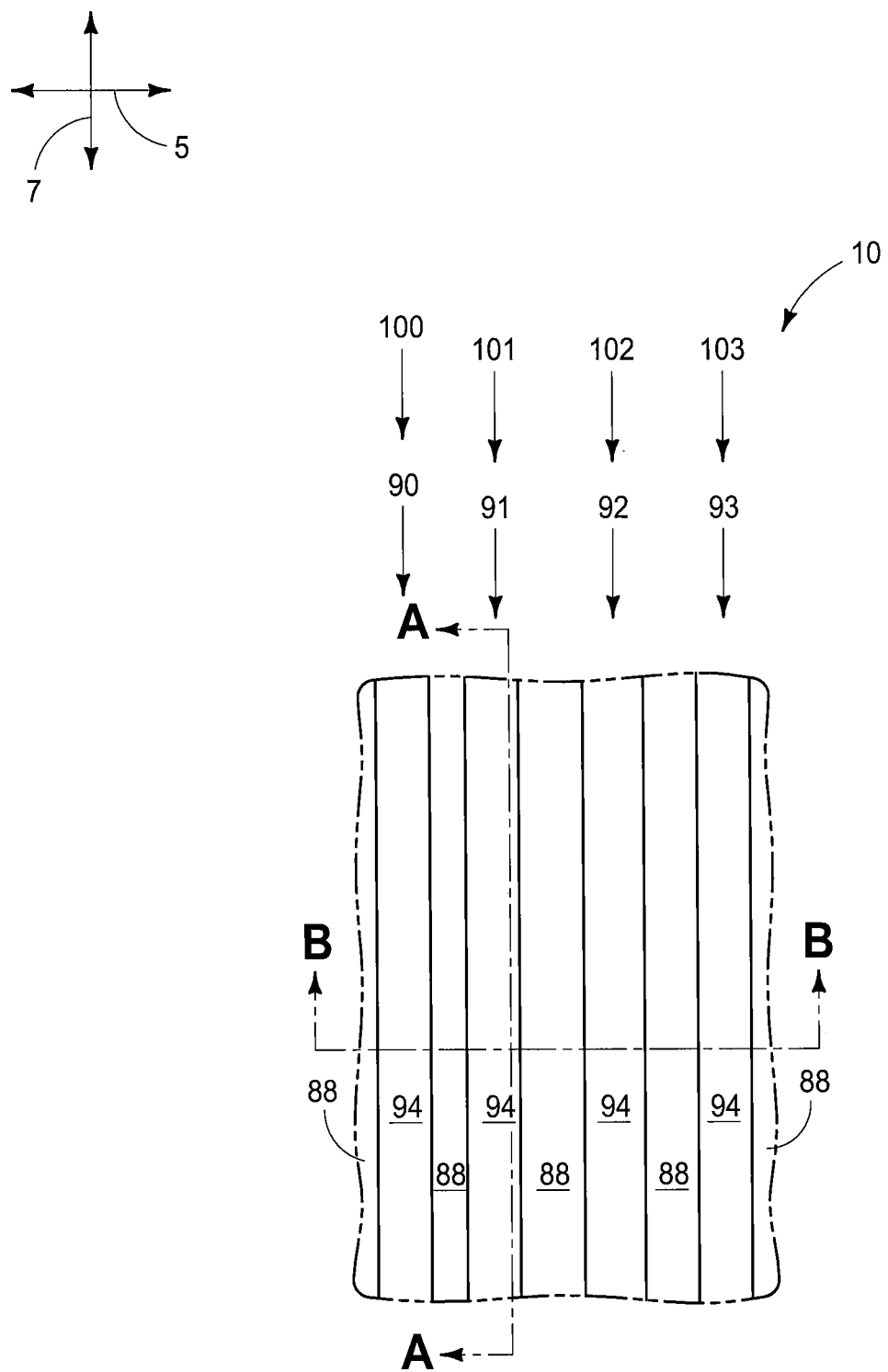
FIGS. 40-42 are a top view and cross-sectional side views of a construction at an example processing stage subsequent to that of FIGS. 37-39. The cross-sectional views of FIGS. 41 and 42 are along the lines A-A and B-B, respectively, of FIG. 40.
Figure 41:
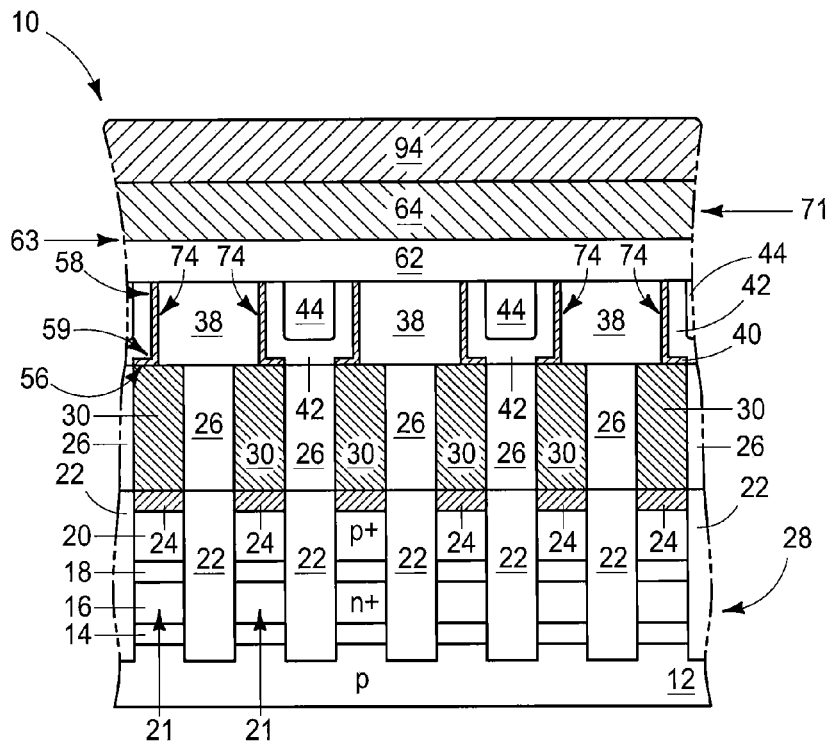
Figure 42:
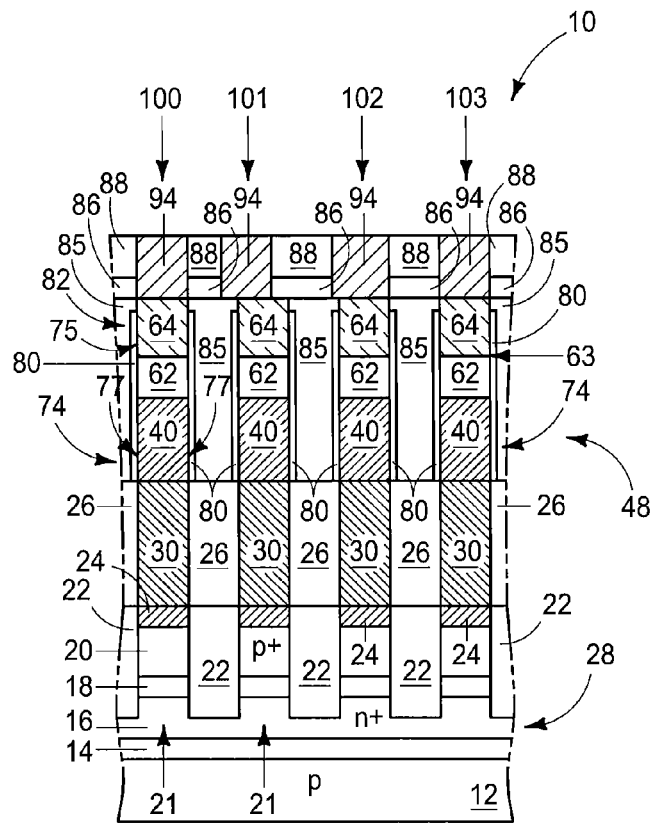

Referring to FIGS. 40-42, electrically conductive material 94 is formed within the trenches 90-93. Such electrically conductive material may comprise any suitable composition or combination of compositions; and in some embodiments may comprise one more of various metals, metal-containing compositions and conductively-doped semiconductor materials. For instance, in some embodiments conductive material 94 may comprise copper surrounded by copper barrier material (for instance, ruthenium-containing material, tantalum-containing material, etc.).

The conductive material 94 is electrically coupled with carbon-containing material 64, and in the shown embodiment directly contacts the carbon-containing material 64.

The conductive material 94 is patterned into conductive structures (specifically, lines) 100-103 within trenches 90-93, respectively. Such patterning may be accomplished with a damascene-type process where the conductive material is provided to initially overfill trenches 90-93 and then excess conductive material is removed with CMP or other suitable planarization to form the structure of FIGS. 40-42.

In the shown embodiment, the structures 100, 102 and 103 are entirely over the carbon-containing material 64 due to trenches 90, 92 and 93 having been properly aligned with such carbon-containing material at the processing stage of FIGS. 37-39. In contrast, the structure 101 is only partially over the underlying carbon-containing material 64, and also extends partially over dielectric material 85. Such is due to the misalignment of trench 91 at the processing stage of FIGS. 37-39. Accordingly, in the shown embodiment the bottom surfaces of conductive structures 100, 102 and 103 only directly contact carbon-containing material 64, while the bottom surface of conductive structure 101 directly contacts both the underlying carbon-containing material 64 and the dielectric material 85.

Figure 43:
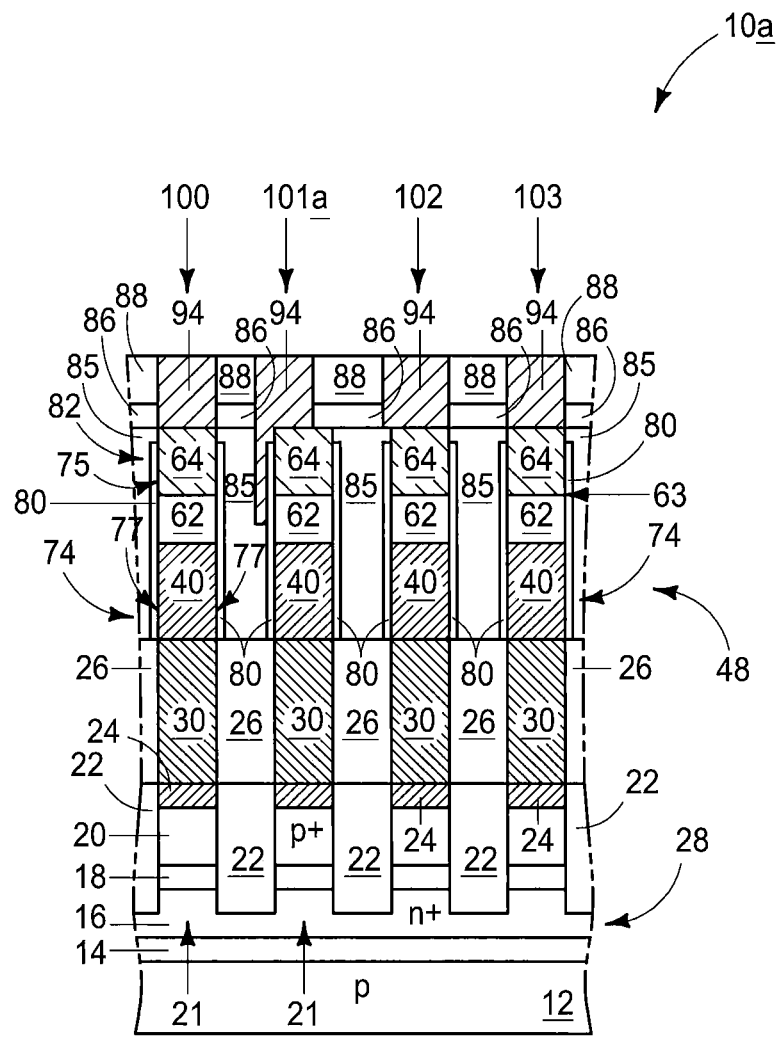
FIG. 43 is a view of a construction at a processing stage analogous to that of FIG. 42 in accordance with an embodiment alternative to that of FIG. 42.

FIG. 42 illustrates an embodiment in which conductive material 94 of misaligned structure 101 is entirely over the carbon-containing material 64. Such structure may result if the etch described above with reference to FIG. 39 forms a misaligned trench 91 which does not penetrate into dielectric material 85. In other embodiments, the misaligned trench may penetrate into dielectric material 85, and accordingly a structure may be formed in which conductive material 94 extends downwardly along sidewalls of carbon-containing material 64 and oxygen-sensitive material 62. FIG. 43 shows a construction 10*a* having a structure 101*a* analogous to that of the structure 101 of FIG. 42, but in which conductive material 94 extends downwardly along sidewalls of carbon-containing material 64 and oxygen-sensitive material 62. The protective material 80 advantageously protects a sidewall of oxygen-sensitive material 62 from being directly exposed by the misaligned trench (analogous to the trench 91 of FIG. 39, but extending into dielectric material 85), and laterally spaces material 94 from the oxygen-sensitive material 62.

In the embodiments described above with reference to FIGS. 4-42, PCM cells are formed to comprise phase change material 62 over heating elements 74 (described above with reference to FIGS. 22-24). In other embodiments analogous to those described herein, phase change material may be utilized without heating elements (i.e., utilized in self-heating memory cells), and the phase change material may be patterned into structures analogous to the angled plate structures of heating elements 74. Also, although the example embodiments described above form PCM cells, in other embodiments analogous processing may be utilized to form other constructions comprising oxygen-sensitive material.

The structures described herein may be incorporated into any of numerous integrated circuit configurations, and such configurations may be utilized in electronic systems. The electronic systems may be used in any of numerous applications such as, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a semiconductor construction. Carbon-containing material is formed over oxygen-sensitive material. The carbon-containing material and oxygen-sensitive material together form a structure having a sidewall that extends along both the carbon-containing material and the oxygen-sensitive material. First protective material is formed along the sidewall. The first protective material extends across an interface of the carbon-containing material and the oxygen-sensitive material, and does not extend to a top region of the carbon-containing material. Second protective material is formed across the top of the carbon-containing material. The first and second protective materials comprise a common composition as one another. The second protective material is etched to expose an upper surface of the carbon-containing material.

Some embodiments include a method of forming a memory array. A plurality of spaced-apart electrical nodes is formed to be supported by a semiconductor substrate. An arrangement of heater element material strips and intervening material is formed over the nodes. The strips extend along a first direction and across pluralities of the nodes. Each strip has a horizontal portion directly against the nodes and has a non-horizontal portion extending upwardly from the horizontal portion. The intervening material is between the strips. A first planarized surface extends across the strips and the intervening material. Phase change material is formed across the first planarized surface. Carbon-containing material is formed over the phase change material. The carbon-containing material, phase change material and heater element material strips are patterned to form structures having sidewalls that extend along the heater element material, the carbon-containing material and the phase change material. The carbon-containing material and phase change material of such structures are configured as lines extending along a second direction that intersects the first direction. First protective material is formed over and between the structures. The first protective material is anisotropically etched to pattern the first protective material into protective spacers along the sidewalls of the structures. The spacers extend across interfaces of the carbon-containing material and the phase change material, and do not extend to a top region of the carbon-containing material. Dielectric material is formed between the structures and over the spacers. The dielectric material is planarized to remove the dielectric material from over the structures and to form a second planarized surface extending across the dielectric material and the structures. Second protective material is formed across the second planarized surface. The second protective material is etched to form trenches extending along the lines which expose carbon-containing material of the lines. Electrically conductive material is formed within the trenches and electrically coupled with the carbon-containing material.

Some embodiments include a semiconductor construction having an oxygen-sensitive material over a supporting substrate. A carbon-containing material is over the oxygen-sensitive material. The carbon-containing material and oxygen-sensitive material are together configured as a structure having a sidewall that extends along both the carbon-containing material and the oxygen-sensitive material. A first protective material is along the sidewall. The first protective material extends across an interface of the carbon-containing material and the oxygen-sensitive material, and does not extend to a top region of the carbon-containing material. Dielectric material is spaced from the oxygen-sensitive material by the first protective material. The dielectric material has an upper surface adjacent an upper surface of the carbon-containing material. A second protective material is over the dielectric material. The first and second protective materials comprising a common composition as one another. A conductive structure extends through the second protective material and directly contacts the carbon-containing material.

Some embodiments include a memory array having spaced-apart electrical nodes supported by a semiconductor substrate. Heater elements are directly over the nodes. The heater elements are angled plates having horizontal portions directly against the nodes and having non-horizontal portions extending upwardly from the horizontal portions. Each angled plate has an interior sidewall where an inside corner is formed between the non-horizontal portion and the horizontal portion, an exterior sidewall in opposing relation to the interior sidewall, and lateral edges between the interior and exterior sidewalls. Electrode/programmable material lines are over the heater elements. The electrode/programmable material lines comprise phase change material over the heater elements and comprise carbon-containing material over and directly against the phase change material. The electrode/programmable material lines have sidewalls that extend along both the carbon-containing material and the phase change material. The sidewalls extend upwardly from the lateral edges of the heater elements. The lines extend along a first direction. Silicon nitride-containing spacers are along the sidewalls. The spacers extend across interfaces of the carbon-containing material and the phase change material, and do not extend to a top region of the carbon-containing material. Oxygen-containing dielectric material is between the lines and over the spacers. Silicon nitride-containing material is over the oxygen-containing dielectric material. Electrically conductive structures extend through the silicon nitride-containing material and directly contact the carbon-containing material of the lines. The electrically conductive structures are lines at least partially directly over the electrode/programmable material lines and extend along the first direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. A semiconductor construction, comprising:
an oxygen-sensitive material over a supporting substrate;
a carbon-containing material over an oxygen-sensitive material; the carbon-containing material and oxygen-sensitive material are together configured as a structure having a sidewall that extends along both the carbon-containing material and the oxygen-sensitive material;
a first protective material along the sidewall, the first protective material extending across an interface of the carbon-containing material and the oxygen-sensitive material, and not extending to a top region of the carbon-containing material;
dielectric material spaced from the oxygen-sensitive material by the first protective material; the dielectric material having a upper surface adjacent an upper surface of the carbon-containing material;

a second protective material over the dielectric material; the first and second protective materials comprising a common composition; and a conductive structure extending through the second protective material and directly contacting the carbon-containing material.

2. The construction of claim 1 wherein the carbon-containing material is directly against the oxygen-sensitive material.

3. The construction of claim 1 wherein the conductive structure is entirely directly over the carbon-containing material.

4. The construction of claim 1 wherein the conductive structure is only partially over the carbon-containing material, and is also partially over and directly contacting the dielectric material.

5. The construction of claim 4 wherein the conductive structure has a portion extending along the sidewall of the structure comprising the containing material and the oxygen-sensitive material; and wherein said portion of the conductive structure is laterally spaced from the oxygen-sensitive material by the first protective material.

6. The construction of claim 1 wherein the first and second protective materials comprise silicon nitride.

7. The construction of claim 1 wherein the carbon-containing material consists essentially of carbon.

8. The construction of claim 1 wherein the carbon-containing material consists of carbon.

9. The construction of claim 1 wherein the oxygen-sensitive material is a phase change material.

10. The construction of claim 1 wherein the oxygen-sensitive material comprises chalcogenide.

11. The construction of claim 1 wherein the oxygen-sensitive material comprises GST.

12. A memory array, comprising:

spaced-apart electrical nodes supported by a semiconductor substrate;

heater elements directly over the nodes, the heater elements being angled plates having horizontal portions directly against the nodes and having non-horizontal portions extending upwardly from the horizontal portions; each angled plate having an interior sidewall where an inside corner is formed between the non-horizontal portion and the horizontal portion, an exterior sidewall in opposing relation to the interior sidewall, and lateral edges between the interior and exterior sidewalls;

electrode/programmable material lines over the heater elements, the electrode/programmable material lines comprising phase change material over the heater elements and comprising carbon-containing material over and directly against the phase change material; the electrode/programmable material lines having sidewalls that extend along both the carbon-containing material and the phase change material; the sidewalls extending upwardly from the lateral edges of the heater elements; the lines extending along a first direction;

silicon nitride-containing spacers along the sidewalls; the spacers extending across interfaces of the carbon-containing material and the phase change material, and not extending to a top region of the carbon-containing material;

oxygen-containing dielectric material between the lines and over the spacers;

silicon nitride-containing material over the oxygen-containing dielectric material; and electrically conductive structures extending through the silicon nitride-containing material and directly contacting the carbon-containing material of the lines; the electrically conductive structures being lines at least partially directly over the electrode/programmable material lines and extending along the first direction.

13. The memory array of claim 12 wherein at least one of the electrically conductive structures is misaligned relative to an underlying electrode/programmable material line so that said at least one electrically conductive structure is only partially over the underlying electrode/programmable material line.

14. The memory array of claim 12 wherein the carbon-containing material consists essentially of carbon.

15. The memory array of claim 12 wherein the carbon-containing material consists of carbon.

16. The memory array of claim 12 wherein the programmable material is phase change material.

17. The memory array of claim 16 wherein the phase change material comprises chalcogenide.

18. The memory array of claim 16 wherein the phase change material comprises GST.

* * * * *